United States Patent [19]

Schlegl

[11] Patent Number: 5,461,341
[45] Date of Patent: Oct. 24, 1995

[54] PULSE STEP MODULATOR

[75] Inventor: William S. Schlegl, Quincy, Ill.

[73] Assignee: Harris Corporation, Melbourne, Fla.

[21] Appl. No.: 268,827

[22] Filed: Jun. 30, 1994

Related U.S. Application Data

[63] Continuation-in-part of Ser. No. 268,260, Jun. 29, 1994.

[51] Int. Cl.$^6$ ........................................................ H03F 3/38
[52] U.S. Cl. ................................................ 330/10; 332/106
[58] Field of Search .................................. 330/10, 207 A, 330/251; 332/106, 115

[56] References Cited

U.S. PATENT DOCUMENTS

| | | | |
|---|---|---|---|
| 4,403,197 | 9/1983 | Swanson | 330/10 |
| 4,560,944 | 12/1985 | Furrer | 330/10 |
| 5,249,201 | 9/1993 | Posner et al. | 332/106 X |

Primary Examiner—Steven Mottola
Attorney, Agent, or Firm—Tarolli, Sundheim & Covell

[57] ABSTRACT

A pulse step modulator (PSM) is presented herein for use in an AM transmitter. The modulator includes a plurality of unit step modules each including a DC voltage source and an associated actuatable switch for, when actuated, turning on the associated module to provide a unit step voltage. An output circuit is connected to the modules for providing an output voltage to a load wherein the magnitude of the output voltage is equal to the sum of all of the voltage sources of the modules that are turned on. An addressable memory is provided which has a plurality of addressable storage locations with each storing and providing, when addressed, a pattern of control signals respectively associated with the modules with each control signal being a turn on signal or a turn off signal for controlling the turn on or turn off of an associated module. The memory is addressed with an address which has a turn on portion and a start point portion. The turn on portion includes information representative of the number of modules that are to be turned on and the start portion includes information representing the address of the first of the modules to be turned on.

34 Claims, 18 Drawing Sheets

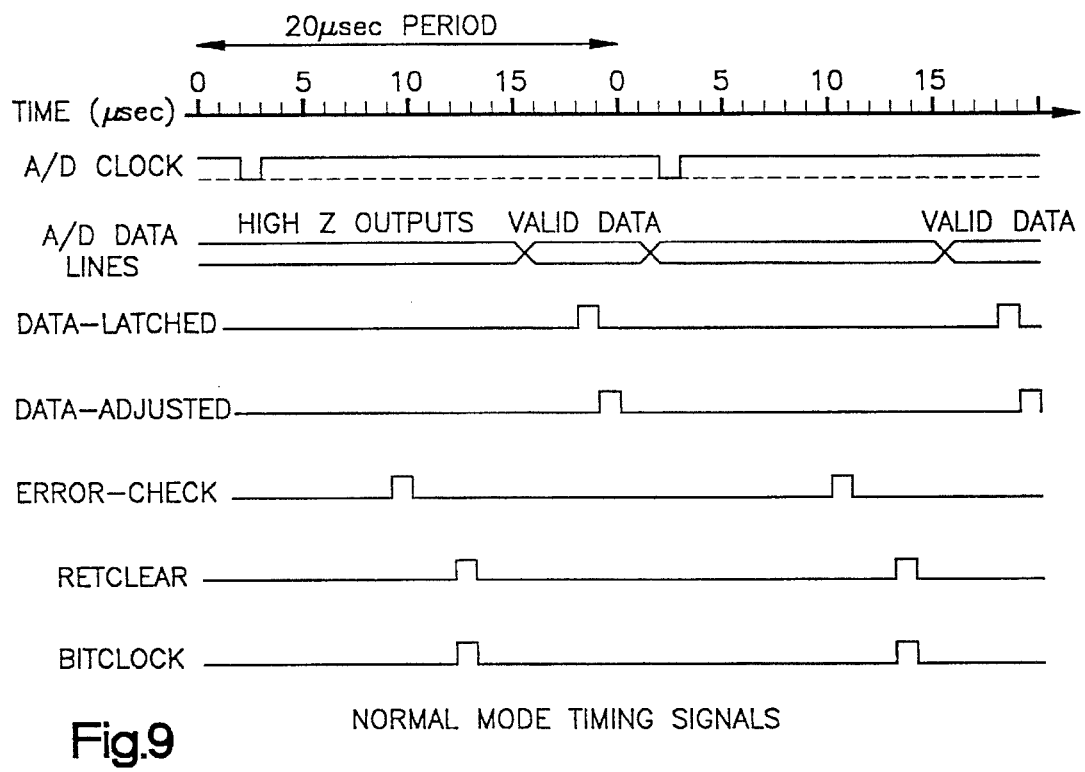
Fig.9  NORMAL MODE TIMING SIGNALS
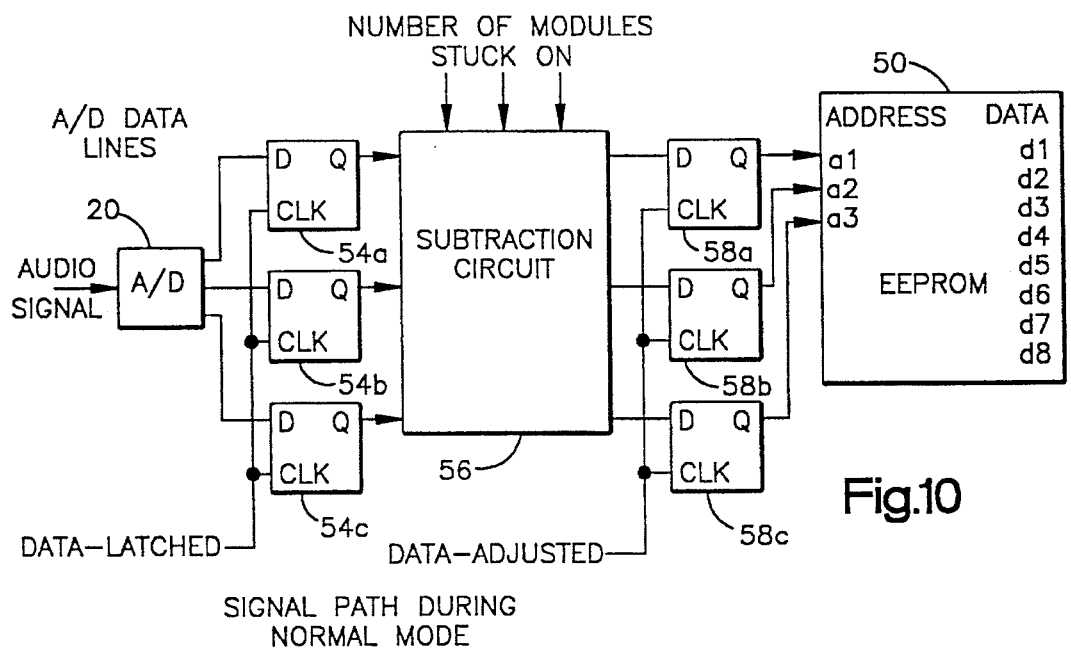
Fig.10
SIGNAL PATH DURING NORMAL MODE 5,461,341

PULSE STEP MODULATOR

RELATED APPLICATIONS

This is a continuation-in-part of my co-pending U.S. patent application Ser. No. 08/268,260, filed on Jun. 29, 1994 and entitled "Improved Modulator Having Encoder for Fault-Adaptive Pulse Step Modulator".

FIELD OF THE INVENTION

This invention relates to the art of modulators and, more particularly, to pulse step modulators which are particularly applicable for use in AM radio broadcasting systems.

DESCRIPTION OF THE PRIOR ART

In AM radio broadcasting in the medium-wave and short-wave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+ DC supply voltage provided to the tube anode. Thus, modulation of the RF signal is achieved through varying the B+ DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in U.S. Pat. No. 4,403,197 to H. I. Swanson. A pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equalling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

The U.S. Patent to A. Furrer U.S. Pat. No. 4,560,944 also discloses a pulse step modulator similar to that as described above. This patent, however, employs a monitor for monitoring the operation of the various unit step modules for purposes of controlling the modulator. Specifically, the circuit serves to provide a first on-first off operation of the various modules. Thus, as the input signal increases in magnitude, the module that has been turned off for the longest will be the first to be turned on. Conversely, as the input signal decreases in magnitude, the module that has been turned on the longest will be the first to be turned off.

SUMMARY OF THE INVENTION

In accordance with the invention, a modulator is provided having a plurality of modules each including a signal source, such as a DC voltage source, and an associated actuatable switch which, when actuated, turns on the associated module to provide a unit signal, such as a step voltage. An output circuit is connected to the modules for providing an output signal to the load wherein the magnitude of the output signal is equal to the sum of all of the signal sources of the modules that are turned on. An addressable memory is provided having a plurality of addressable storage location each storing and providing, when addressed, a pattern of control signals respectively associated with the modules with each control signal being a turn on signal or a turn off signal for controlling the turn on or turn off of an associated module. Addressing circuitry is provided for addressing the memory with addresses with each address including a turn on portion and a start portion with the turn on portion including information representative of the number of modules that are to be turned on and the start portion including information representing the address of the first one of the N modules to be turned on.

BRIEF DESCRIPTION OF THE DRAWINGS

The foregoing and other objects and advantages of the invention will become more readily apparent from the following description as taken in conjunction with the accompanying drawings, wherein:

FIG. 9 includes graphical waveforms of voltage with respect to time useful in explaining the invention;

FIG. 10 is a schematic-block diagram illustration illustrating signal path during the normal mode of operation;

DESCRIPTION OF A PREFERRED EMBODIMENT

Figure 1:
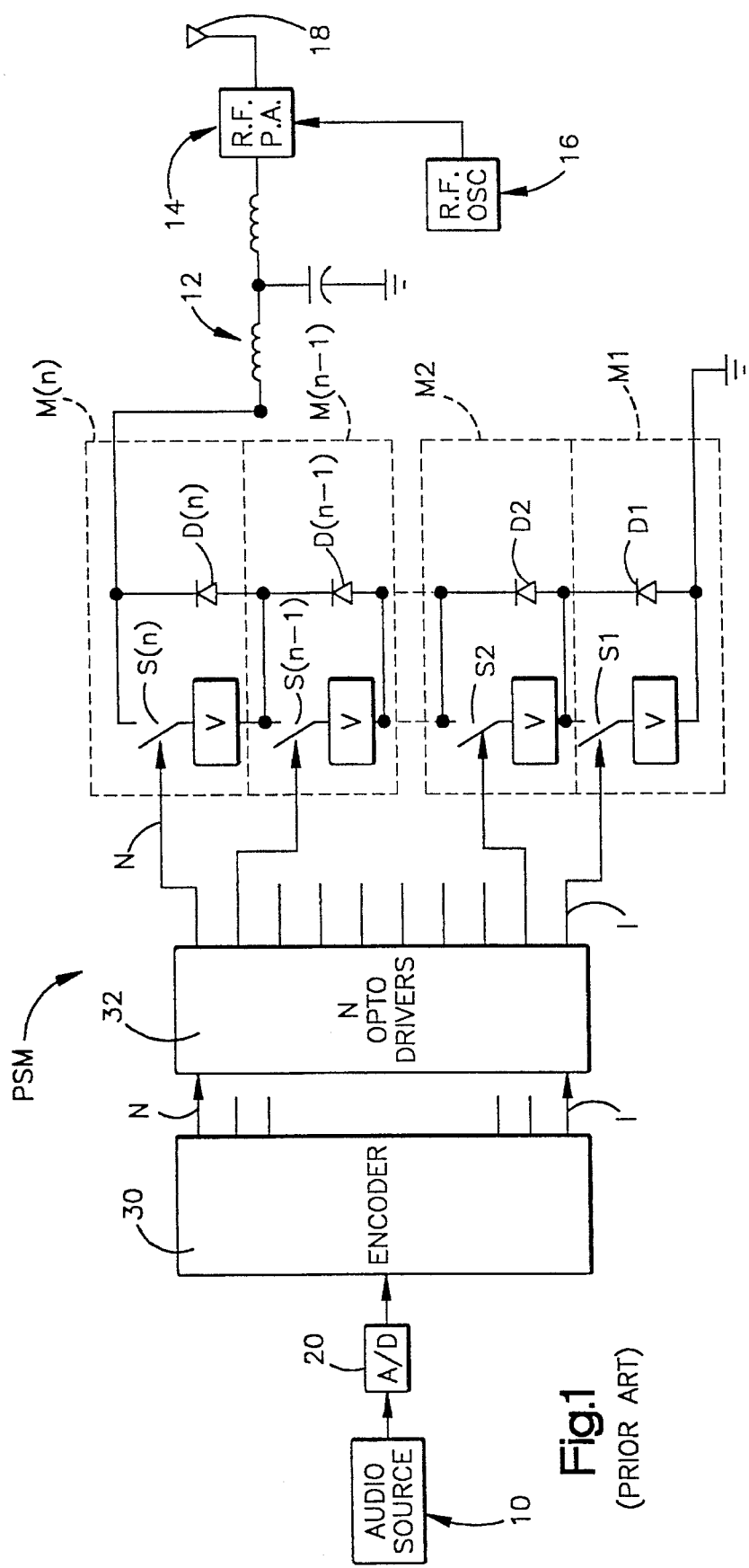
FIG. 1 is a schematic-block diagram illustration of a prior art AM broadcasting transmitter employing a pulse step modulator (PSM)

Reference is now made to the drawings wherein the showings are for purposes of illustrating a preferred embodiment of the invention only and not for purposes of limiting same. FIG. 1 illustrates an AM transmitter which incorporates a pulse step modulator (PSM). The transmitter includes an audio source 10 which generates an amplitude and frequency varying audio signal which is to be amplified and transmitted. This signal is supplied by way of a conventional analog-to-digital converter 20 to a pulse step modulator (PSM). The pulse step modulator, to be described in greater detail hereinafter, amplifies the signal to a high power level and provides a resulting amplitude signal $V_{out}$ to a low pass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The analog-to-digital converter 20 receives the analog audio signal from the audio source 10 and converts it into a multi-bit digital representation thereof. For example, the analog input signal may be converted into a 12 bit digital signal. The six most significant bits are supplied to a decoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

Figure 2A:
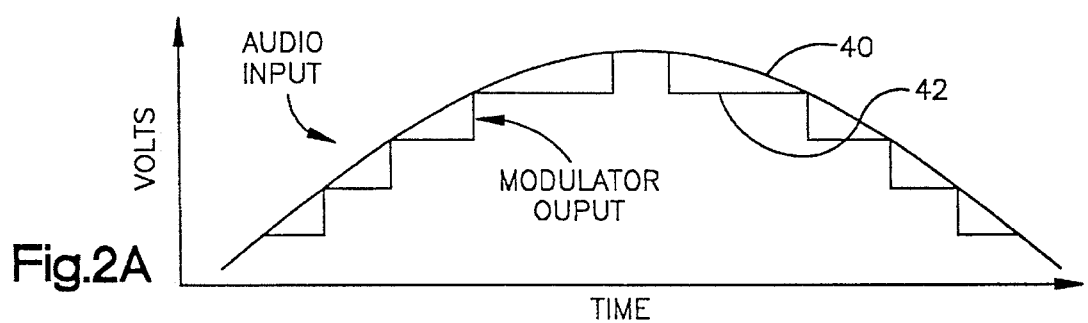
FIG. 2 includes FIGS. 2A and 2B which are graphical waveforms of voltage with respect to time useful in explaining the background of the invention.
Figure 2B:
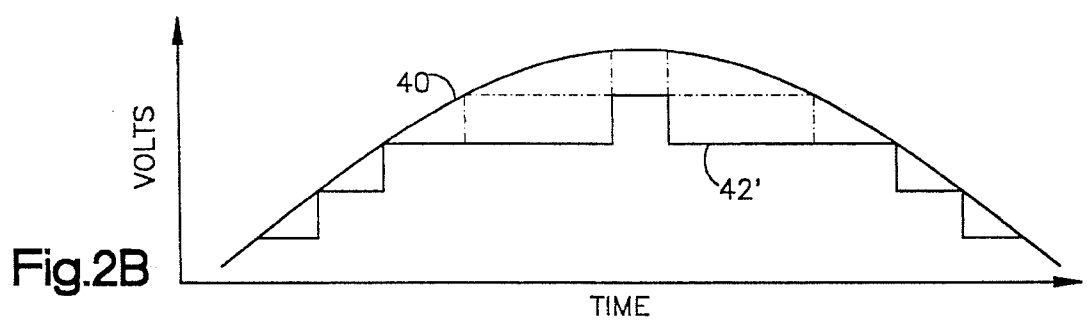

The switches associated with the unit step modules must be capable of handling such a voltage and the ensuing current. Consequently, these switches, in practice, take the form of IGBT or GTO transistor switches. If a switch fails, distortion will result in the output voltage. Reference is now made to FIG. 2A which illustrates an audio input voltage 40 which represents an input signal obtained from an audio source 10 and wherein the input signal is an amplitude and frequency varying signal which is to be amplified and transmitted. Superimposed on the input signal 40 there is illustrated an output modulator voltage 42 which is a step voltage and which increases and decreases in incremental step voltages with increasing and decreasing values of the input signal 40. For purposes of simplification, no amplification is illustrated in these waveforms. FIG. 2B is similar to that of FIG. 2A but shows the modulator output voltage 42' as it results when one of the unit step modules has failed in an off condition. This results in a distorted output waveform and will remain distorted even after being passed by the filter 12.

The present invention is directed toward an improved pulse step modulator (PSM) system that incorporates an improved encoder and means for controlling the encoder over those illustrated in FIG. 1. The encoder 30 of FIG. 1 provides a plurality of turn on signals on its outputs 1 through N in accordance with the number of modules M1 through M(n) are to be turned on. The number is determined by the magnitude of the output from the analog-to-digital converter and which, in turn, depends upon the magnitude of the signal obtained from the audio source 10. In the embodiment to be described hereinafter, the encoder includes an addressable memory which receives addresses from an analog-to-digital converter and each address provides an output pattern of turn on signals for turning on selected modules M1 through M(n) in accordance with the magnitude of the analog signal provided by the audio source 10. As will be brought out hereinafter, the number of turn on signals provided by the encoder may need to be changed depending upon whether one or more of the modules has failed. In such case, the memory is rewritten to provide a different number of turn on signals than that which would have been the case had all of the modules operated properly.

Figure 3:
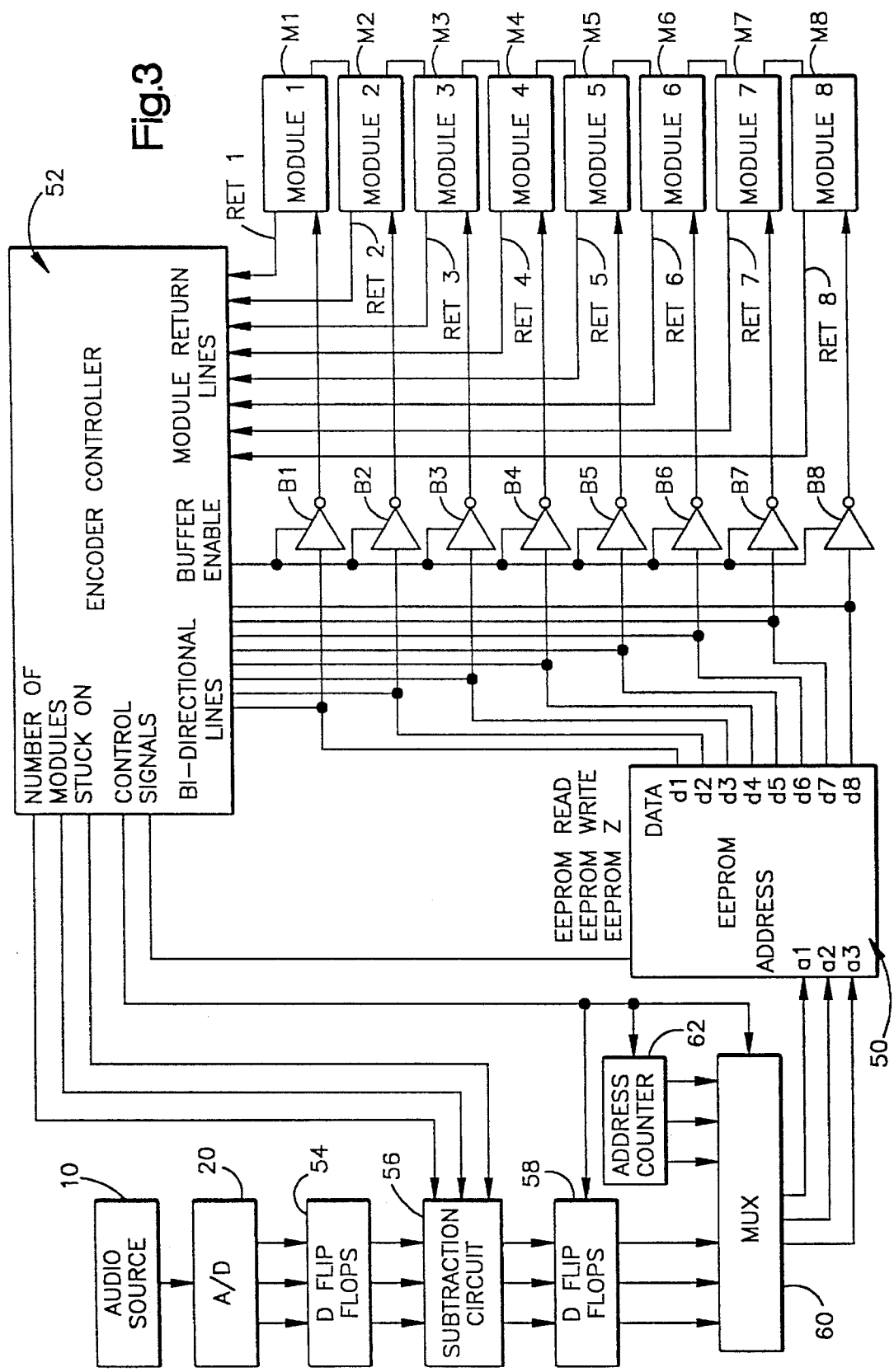
FIG. 3 is a schematic-block diagram illustration of a pulse step modulator incorporating the present invention.

Reference is now made to FIG. 3 which illustrates an embodiment of the invention in accordance with the present invention wherein the encoder includes an addressable memory 50. This memory preferably takes the form of an electrically erasable programmable read only memory (EEPROM). This memory has addressable inputs a1, a2 and a3 and has data input/output lines d1 through d8. The data lines are bi-directional lines and are connected to encoder controller 52. As will be described in greater detail hereinafter, the encoder controller 52 is coupled to the modules, in this case modules M1 through M8 (only eight modules are shown for simplicity in this explanation). The encoder controller keeps track of the number of modules that are stuck on. The number of modules that are to be turned on is provided at the output of the analog-to-digital converter 20. These outputs are applied through a set of D-type flip-flops 54 and thence to a subtraction circuit 56. As will be brought out hereinafter, the subtraction circuit 56 subtracts from the number supplied by the A/D converter 20 the number of modules that are stuck on. The result is supplied through a set of D flip-flops 58 and a multiplexer 60 to the address input of the memory 50. Periodically, the memory will be rewritten or reprogrammed to reflect the number of failed modules. This will be accomplished under the control of the encoder controller 52 which will address the memory by means of an address counter 62 and write new data into selected addresses by way of the bi-directional data lines. The encoder controller senses the number of modules that are failed and serves to reprogram the memory 50 to compensate for the failed modules.

The outputs of the memory 50 are connected to the modules M1 through M8 by way of tri-state buffers B1 through B8, respectively. Whenever these buffers are enabled by the encoder controller, the output patterns obtained from the memory 50 are supplied as a pattern of turn on and turn off signals (binary 1 and binary 0 signals) to turn on selected ones of the modules. Whenever the memory 50 is being reprogrammed or rewritten, the buffers are not enabled and data is written into the memory with the data being provided on the bi-directional lines. The encoder controller 52 monitors the operation of modules 1 through 8 which respectively are provided with return lines RET1 through RET8 which connect with the encoder controller and serve to provide information as to the status of the modules.

It is to be understood that whereas only eight modules M1 through M8 are illustrated in FIG. 3, various numbers of modules may be employed in actual practice. For example, a six bit output from the analog-to-digital converter 54 may serve to operate 46 modules. This number of modules may be served by connecting together eight memories, each constructed as in the case of memory 50. The example presented herein is limited to eight modules for purposes of simplifying the description only.

In the discussions that follow, two examples are presented to illustrate the encoder mapping scheme employed herein. The first example assumes that no modules have failed and the second example assumes that two modules have failed. In the first example reference is made to Table I below.

TABLE I

| EEPROM Address | | | EEPROM Data Outputs | | | | | | | |
| --- | --- | --- | --- | --- | --- | --- | --- | --- | --- | --- |
| a3 | a2 | a1 | d1 | d2 | d3 | d4 | d5 | d6 | d7 | d8 |
| 0 | 0 | 0 | 0 | 0 | 0 | 0 | 0 | 0 | 0 | 0 |
| 0 | 0 | 1 | 1 | 0 | 0 | 0 | 0 | 0 | 0 | 0 |
| 0 | 1 | 0 | 1 | 1 | 0 | 0 | 0 | 0 | 0 | 0 |
| 0 | 1 | 1 | 1 | 1 | 1 | 0 | 0 | 0 | 0 | 0 |
| 1 | 0 | 0 | 1 | 1 | 1 | 1 | 0 | 0 | 0 | 0 |
| 1 | 0 | 1 | 1 | 1 | 1 | 1 | 1 | 0 | 0 | 0 |
| 1 | 1 | 0 | 1 | 1 | 1 | 1 | 1 | 1 | 0 | 0 |
| 1 | 1 | 1 | 1 | 1 | 1 | 1 | 1 | 1 | 1 | 0 |

This Table shows the data stored at each of the eight addressable locations in the memory 50 with no failed modules. Thus, if the A/D converter 20 requests that four modules be turned on, four is the address of memory 50. Address four, which takes the form of the binary bit pattern 100 will produce a pattern from the memory of 11110000. Thus, at address four, turn on signals will be provided at the memory outputs d1, d2, d3, d4 and no turn on signals will be provided at the other outputs. This will cause activation of modules M1, M2, M3 and M4. Similarly, if the output of the A/D converter 20 is six, then six modules need to be turned on. Six is also used as the address for memory 50. From Table I it will be noted that the contents at address six (110) is a pattern of 11110000. Consequently, modules M1 through M6 will be turned on and modules M7 and M8 will not be turned on. It is not necessary that when six modules are required to be turned on that the first six be turned on as opposed to the last six or some other group of six.

Reference is now made to Table II which is similar to that of Table I but shows the contents of memory 50 when modules 4 and 6 have failed and the memory has been rewritten to reflect this condition.

TABLE II

| EEPROM Address | | | EEPROM Data Outputs | | | | | | | |
| --- | --- | --- | --- | --- | --- | --- | --- | --- | --- | --- |
| a3 | a2 | a1 | d1 | d2 | d3 | d4 | d5 | d6 | d7 | d8 |
| 0 | 0 | 0 | 0 | 0 | 0 | 0 | 0 | 0 | 0 | 0 |
| 0 | 0 | 1 | 1 | 0 | 0 | 0 | 0 | 0 | 0 | 0 |
| 0 | 1 | 0 | 1 | 1 | 0 | 0 | 0 | 0 | 0 | 0 |
| 0 | 1 | 1 | 1 | 1 | 1 | 0 | 0 | 0 | 0 | 0 |
| 1 | 0 | 0 | 1 | 1 | 1 | 1 | 1 | 0 | 0 | 0 |
| 1 | 0 | 1 | 1 | 1 | 1 | 1 | 1 | 1 | 1 | 0 |
| 1 | 1 | 0 | 1 | 1 | 1 | 1 | 1 | 1 | 1 | 1 |
| 1 | 1 | 1 | 1 | 1 | 1 | 1 | 1 | 1 | 1 | 1 |

It is to be noted that the memory is rewritten regardless of whether the modules are detected as having failed in a stuck on condition or a stuck off condition.

Assume that both modules 4 and 6 are stuck off. If the output from the A/D converter 20 requests that five modules be turned on, then this information is supplied to the subtractor circuit 56 with the other input to the subtractor being zero, since no modules are stuck on. The address to the memory is 5 (101) resulting in a turn on signal pattern of 11111110. The "1" at data output D4 cannot turn on module 4 since module 4 is broke. Also, the "1" at data output 6 cannot turn on module 6. The result is that five modules (modules M1, M2, M3, M5 and M7) will be turned on.

Assume that modules M4 and M6 are stuck on. Again, the output from the A/D converter 20 is five, requesting that five modules be turned on. Since the number of modules that are stuck on are two, the encoder controller 52 supplies that information to the subtraction circuit 56 which provides an output of three, requesting that only three modules be turned on. The address of three (011) is then supplied to the memory 50 by way of the multiplexer 60. The turn on pattern stored at address 3 in table II is 11100000. Consequently, modules M1, M2 and M3 are turned on. However, since modules M4 and M6 are stuck on, a total of five modules are on.

Assume that module M4 is stuck off and that module M6 is stuck on. Also, assume that the output of the A/D converter 20 is requesting that five modules be turned on and, accordingly, this number is supplied to the subtraction circuit 56. The other input to the subtraction circuit is "1", since only one of the failed modules is stuck on. The difference of four serves as the output of the subtraction circuit 56 and this is supplied through the D flip-flops 58 and the multiplexer 60 to the address inputs a1, a2 and a3 of memory 50. The contents of the memory 50 at address 4 (100) is (from Table II) 11111000. Module M4 is stuck off and module 6 is stuck on. Consequently, a total of five modules are on. This includes modules M1, M2, M3, M5 and M6. It is to be noted that failed modules will limit the dynamic range of the amplifier, but the encoding scheme discussed hereinabove will compensate for distortions which would otherwise occur, as is discussed hereinbefore with respect to FIG. 2B.

Encoder Controller

The encoder controller 52 includes circuitry, to be described in greater detail hereinafter, that senses a failed module and then rewrites the memory 50 to compensate for the failed module or modules. Thus, if modules 4 and 6 fail, then the memory would be rewritten from that as illustrated in Table I to that as illustrated in Table II discussed hereinabove.

The encoder controller 52 (FIG. 3) includes various discrete logic gates and has three modes of operation including a normal mode, a module check mode, and a memory write mode. In the normal mode, the data outputs from the memory 50 are used to turn the various modules M1 through M8 on. During this mode of operation, the tri-state buffers B1 through B8 are enabled, permitting the turn on signals from the memory 50 to be supplied through the buffers to the appropriate modules. The memory 50 is set to read in this mode of operation and data from the A/D converter 20 is latched in the D flip-flops 54 and the data output from the subtraction circuit 56 is latched in the D flip-flops 58 and then supplied as an address to the multiplexer 60 to the address inputs of the memory 50. The encoder controller includes circuitry that monitors the return lines RET1 through RET8 from the modules M1 through M8, respectively, to determine whether the modules are operating properly.

If the encoder controller senses an error from the status of the return line RET1 through RET8, it then goes into a module check mode, to be described in greater detail hereinafter. In this mode, the memory 50 is set so that the output lines are in a high impedance (Z) state. The tri-state buffers B1 through B8 are enabled. The encoder controller 52 sends data by way of the bi-directional lines to sequentially turn on the modules M1 through M8. The modules then send return signals to the controller on lines RET1 through RET8 and the controller determines which modules have failed and whether a failed module is stuck on or stuck off. The controller 52 then uses this information to reprogram memory 50.

Thereafter, the controller operates in a memory write mode. In this mode, the tri-state buffers B1 through B8 are disabled so that the modules M1 through M8 will not be turned on while the memory 50 is being rewritten. During this mode, the address for memory 50 is obtained from the address counter 62 controlled by controller 52. This address is supplied through the multiplexer 60, also controlled by the controller 52, with the address then being supplied to the memory 50. The data obtained from the bi-directional lines of controller 52 is then supplied to the memory at the selected address and written into the memory. After the memory 50 has been rewritten as described, the controller reverts to the normal mode of operation.

Return Signals

The return signals on return lines RET1 through RET8 from modules M1 through M8, respectively, are supplied to the controller which then determines the number of modules that are disabled and whether a disabled module is stuck on or stuck off. The return information may be representative of a stuck on condition, a stuck off condition or that the module is working correctly. The three conditions are illustrated in FIG. 4 (which includes FIGS. 4A, 4B and 4C).

Figure 4A:
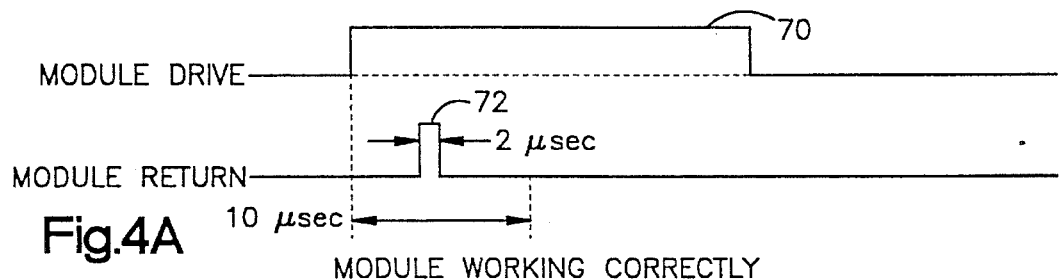
FIG. 4 includes FIGS. 4A, 4B and 4C which are graphical waveforms of voltage with respect to time useful in explaining the invention.

As shown in FIG. 4A, the module drive signal 70 provided by the controller to each of the modules M1 through M8 takes the form of a positive voltage having a duration on the order of approximately 20 microseconds. If the module receiving such a drive signal is working correctly, then it will send a return signal 72, which may have a duration on the order of 2 microseconds, to the encoder controller. This return signal will take place within a time period of approximately 10 microseconds from the commencement of the drive signal 70.

Figure 4B:
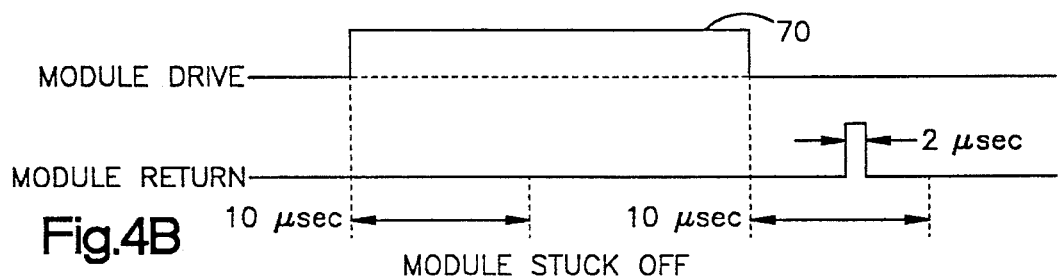

Reference is now made to FIG. 4B which shows the signal conditions when a module is stuck off. When the module drive lines goes HIGH, as indicated by signal 70, there is no return pulse. This indicates to the controller that the module is broken. After the drive signal 70 goes LOW, then a pulse on the order of 2 microseconds may take place within the next 10 microseconds. This tells the controller that the module is stuck off.

Figure 4C:
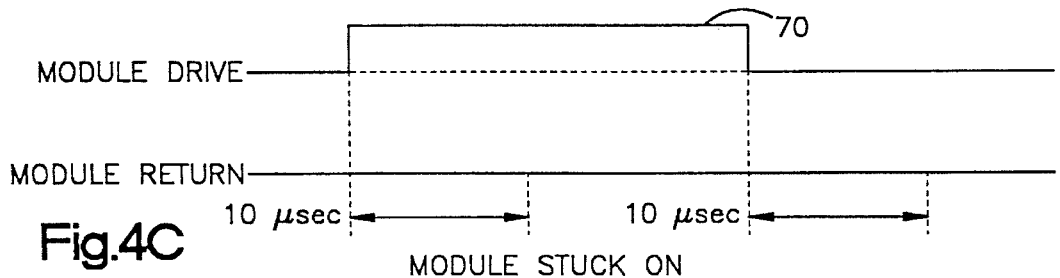

Reference is now made to FIG. 4C which shows the return signal condition when a module is stuck on. During the period that the drive signal 70 is HIGH, there is no return signal, such as in the case of the example with reference to FIG. 4A. As before, this tells the controller that the module is broken. After the module drive signal 70 goes LOW, no pulse occurs during the next 10 microseconds. This tells the controller that the broken module is stuck on.

Encoder Controller

Figure 5:
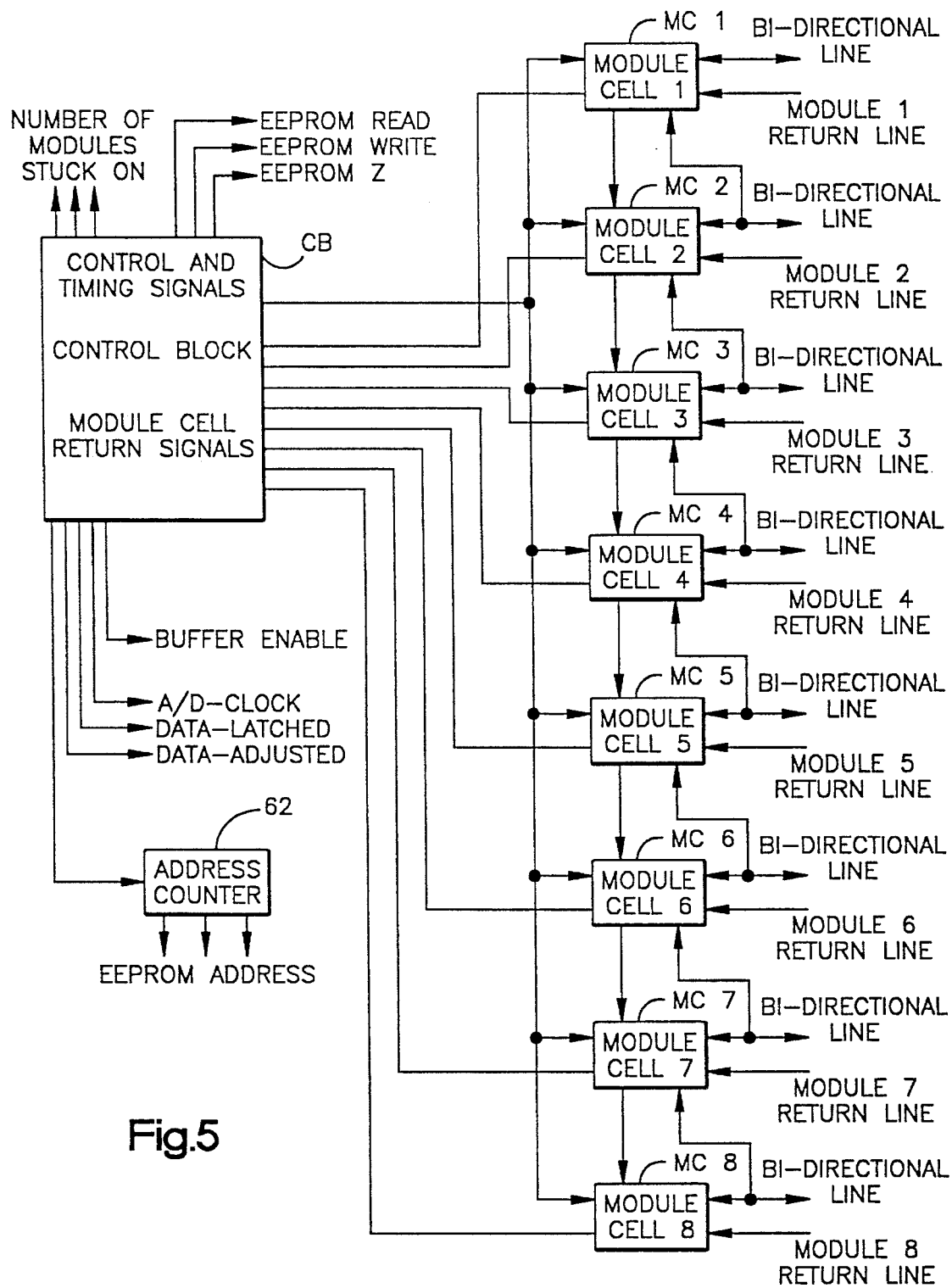
FIG. 5 is a schematic-block diagram illustration showing the encoder controller of FIG. 3 in greater detail.

The encoder controller 52 for an eight module system as described herein, takes the form as shown in FIG. 5. The timing and control signals discussed hereinbefore are provided by a control block CB which is interconnected with a plurality of module cells MC1 through MC8. Each module cell MC1 through MC8 is associated with a respective one of the modules M1 through M8 described hereinbefore with reference to FIG. 3. Each module cell keeps track of the workings of its associated module and reports this information to the control block CB. The control block CB generates the control and timing signals that are sent to each of the module cells as well as those that are sent to other circuits in FIG. 3 including memory 50.

The control block CB also sends out the EEPROM read, the EEPROM write, and the EEPROM Z signals to control the memory 50. A buffer enable line is connected to each of the buffers B1 through B8 and serves, when HIGH, to enable the various buffers. One output of the control block is supplied to the address counter 62 (see FIG. 3) which is used to provide the addresses for the memory 50 when the memory is being rewritten. The A/D-CLOCK pulse provided by the control block CB is supplied to the A/D converter 20 to start the data conversion in a conventional manner. The DATA LATCHED pulse provided by the control block CB is a pulse that is employed for latching the output of the A/D converter 20 in the D flip-flops 54 in a conventional manner. The DATA ADJUSTED pulse provided by the control block CB is a pulse that is employed for latching the data from the subtraction circuit 56 into the D flip-flops 58 in a conventional manner. This is the data that is then employed for driving the memory 50. The control block CB includes a counter which is used to count all of the return line signals that indicate that a module has been stuck on. The output from this counter provides the number of modules stuck on signal as a count to the subtraction circuit 56.

In accordance with the present invention, each of the modules M1 through M8 employs fault detecting means for detecting whether the module has failed and, if so, whether the module failed as being stuck off or being stuck on. Circuitry to accomplish this is illustrated in FIG. 6 to which reference is now made.

Figure 6:
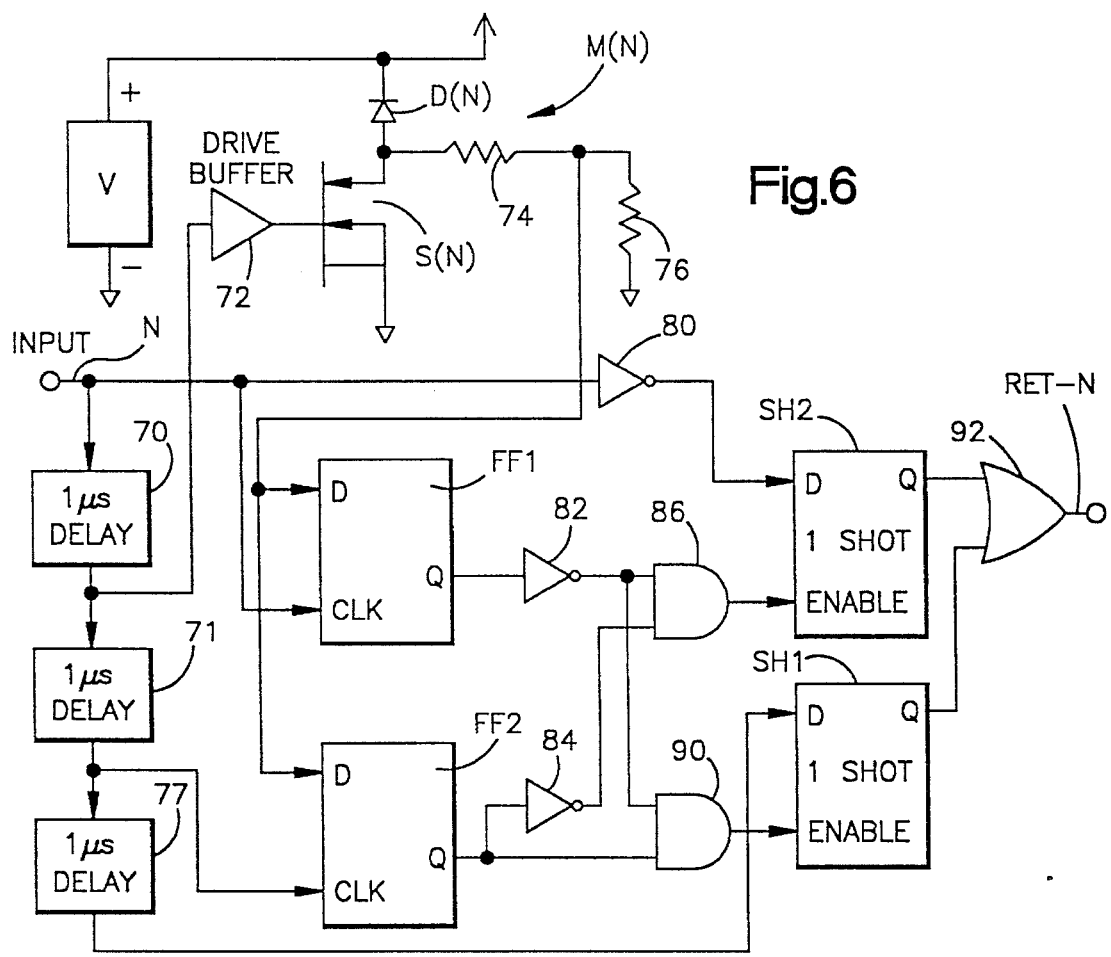
FIG. 6 is a schematic-block diagram illustration of a fault detection circuit employed in the invention.
Figure 7:
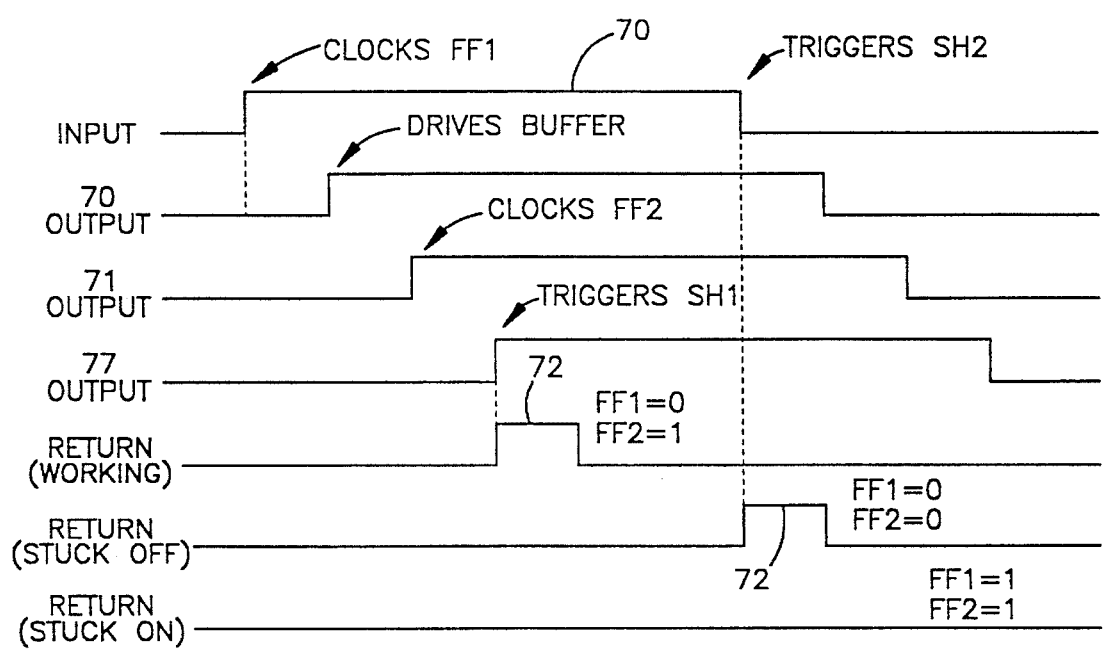
FIG. 7 includes graphical waveforms of voltage with respect to time useful in explaining the invention.

Each fault detector takes the form as that illustrated in FIG. 6 and this fault detector is connected to one of the step modules M(n). In this module, the switch S(n) is illustrated as being a semiconductor switch and which receives its control input from a control line N taken from the encoder controller 52 by way of one of the buffer amplifiers. This control line N applies a drive input or turn on signal as a positive or binary 1 signal to a one microsecond delay circuit 69 and thence through a drive buffer 73 to the switch S(n). This drive input 70 also clocks a flip-flop FF1, as shown in FIG. 7. When the transistor switch is turned on, a unit step voltage V appears across a voltage divider including resistors 74 and 76. The junction of this voltage divider is connected to the D inputs of flip-flops FF1 and FF2. The delay drive to the switch S(n) is also delayed by delay circuit 71 and serves to clock flip-flop FF2. The delayed output from circuit 71 is supplied through a delay 77 which serves to clock a one-shot circuit SH1. The input is also inverted by an inverter amplifier 80 and supplied to the clock input of a second one-shot circuit SH2. The Q outputs of flip-flops FF1 and FF2 are supplied through inverter amplifiers 82 and 84 to an AND gate 86 which supplies an enabling signal to the enable input of the one-shot circuit SH2. The inverted output from inverter amplifier 82 and the non-inverted output from the Q output of flip-flop FF2 are supplied to an AND gate 90 the output of which is supplied to an enable input of the one-shot circuit SH1. The Q outputs of one-shot circuits SH1 and SH2 are applied to an OR gate 92 to provide the return signal to the encoder controller by way of the appropriate return lines RET1 through RET8.

Each of the one-shots SH1 and SH2 will provide a 2 microsecond return pulse when the circuit has been enabled and receives a clock pulse. Considering FIGS. 4 and 7, it will be noted that when the module drive signal 70 is on and the module is working properly, then the return pulse 72 will take place within the first 10 microseconds after the drive signal 70 goes positive. Also, if the module is stuck off (see FIG. 4B) the return pulse 72 will take place after the drive signal 70 goes low. When the module is working properly, the output of flip-flop FF1 will be zero and the output of flip-flop FF2 will be 1. If the module is not working properly but is stuck off, then the output of flip-flop FF1 will be zero and the output of flip-flop FF2 will be zero. Also, if the module is stuck on, then the outputs of both flip-flops FF1 and FF2 will be 1. Stated otherwise, the output of flip-flop FF1 is zero if the module is stuck off or is working. Also, the output of flip-flop FF1 will be 1 if the module is stuck on. Similarly, if the output of flip-flop FF2 is one, then the module is working or is stuck on. If the output of flip-flop FF2 is zero, then the module is stuck off.

Module Cells

The module cells MC1 through MC8 serve four functions. They are used to determine if the modules are working correctly, to keep track of a broken module, to determine if a module is stuck on or off and to rewrite the memory 50. The module cells are interconnected, as shown in FIG. 5, and the module return line from each of the modules M1 through M8 is connected to its associated module cell, as will be described in greater detail hereinafter. The bi-directional lines connected to each module cell are used for monitoring the outputs of the memory 50 and also for turning on the various modules M1 through M8 and also for writing data to be stored in the memory. The bi-directional line associated with each module cell is also connected to the immediately preceding module cell.

Module Cell

Figure 8:
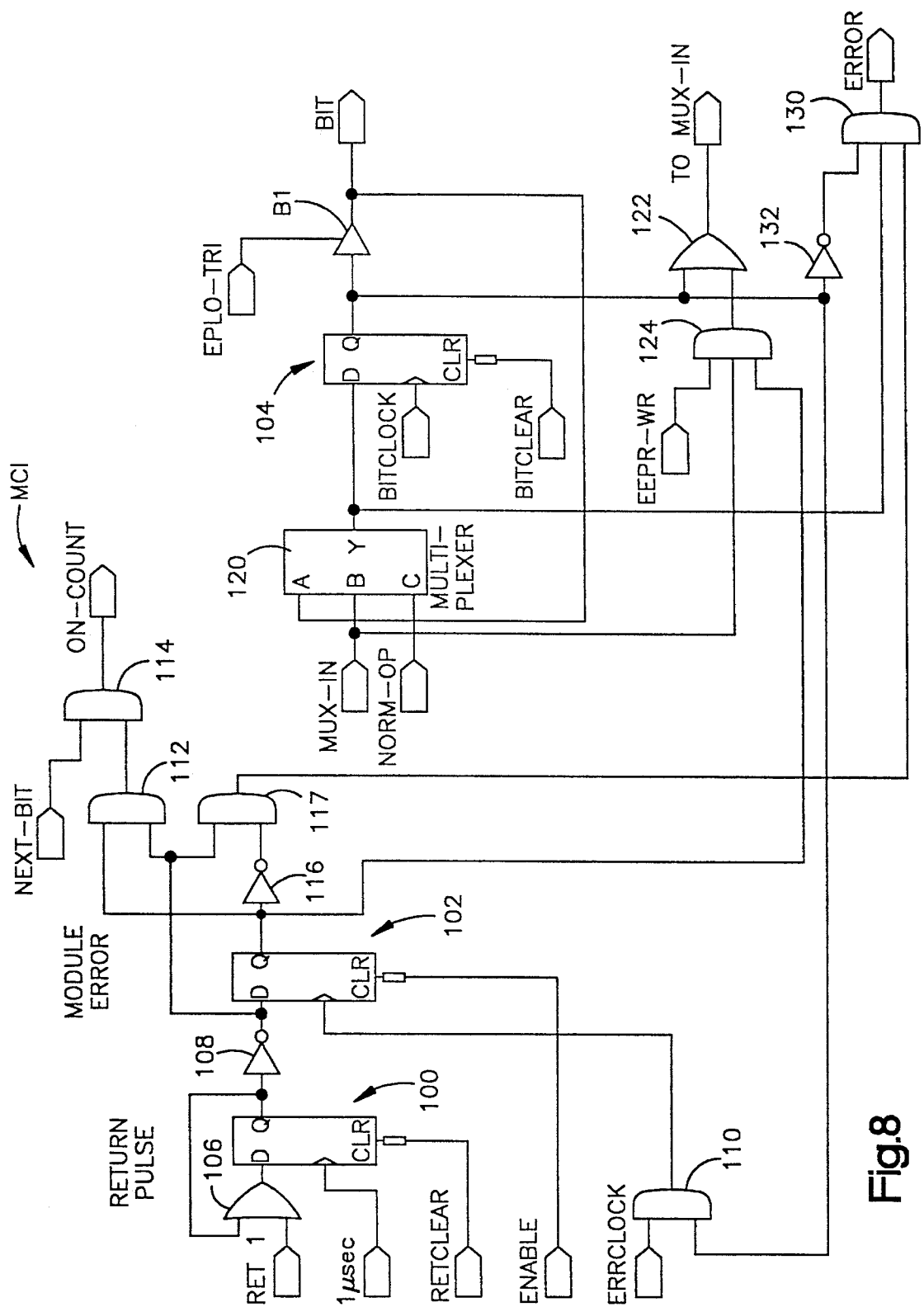
FIG. 8 is a schematic-block diagram illustration illustrating a module cell employed in the encoder controller of FIG. 5.

Each of the module cells MC1 through MC8 takes the form of the module cell MC1 shown in FIG. 8. That module cell includes three D-type flip-flops including a return pulse flip-flop 100, a module error flip-flop 102 and a module flip-flop 104.

The return pulse flip-flop 100 is used to receive the 2 microsecond return pulse from the module over the input line RET1. The 1USEC line serves as the clock input for this flip-flop. The RETCLEAR input is used to clear the flip-flop. The output from the Q output terminal of the flip-flop is fed back to the D input terminal of the flip-flop by way of an OR gate 106. The Q output terminal of flip-flop 100 is supplied by way of an inverter amplifier 108 to the D input of the module error D flip-flop 102. This flip-flop is set to a one when the module associated with the flip-flop has failed (to be described in greater detail hereinafter). An ERRCLOCK signal pulse is applied through an AND gate 110 serves as the clock for this flip-flop. The flip-flop is cleared by a pulse applied to its ENABLE input. The output of the inverter amplifier 108 is also supplied to one input of an AND gate 112 and to one input of an AND gate 117. The other input to AND gate 112 is obtained from the Q output of flip-flop 102. The other input to AND gate 117 is obtained from the Q output of flip-flop 102 by way of an inverter amplifier 116. The output of AND gate 112 serves as one input to an AND gate 114 having its second input obtained from a NEXT-BIT input. The output of the AND gate 114 appears on an output line ON-COUNT (to be described in greater detail hereinafter).

The module D flip-flop 104 has three functions. First, during a normal mode it keeps track of the previous value of a module. Second, during a module check mode, the tri-state buffer is enabled and the module D flip-flop is used to turn a module on or off. Third, during the EEPROM write mode, the tri-state buffer is again enabled, and the module D flip-flop is used to write data into the memory 50. The module D flip-flop 104 has a multiplexer 120 associated therewith and the output of the multiplexer is supplied to the D input of flip-flop 104. The clock for this flip-flop is obtained from a BIT CLOCK input. The clear for this flip-flop is obtained from a BIT CLEAR input. The multiplexer has an input obtained from a MUX-IN input which is supplied to the B input and a control signal is applied to the S input from a NORM-OP line. The A input of the multiplexer is taken from the output of a buffer B1. This buffer is enabled by a positive pulse on its EPLO-TRI input. The Q output of flip-flop 104 is also supplied to one input of an OR gate 122 having a second input obtained from an AND gate 124. This AND gate has an input obtained from the EEPR-WR line and a second input from the MUX-IN line and a third input from the Q output of flip-flop 102.

The Q output of flip-flop 104 is also supplied to one input of an AND gate 130 by way of an inverter amplifier 132. A second input to this AND gate is obtained from the output of multiplexer 120 and a third input to the AND gate is obtained from the output of AND gate 117. The output of the AND gate 130 is the ERROR output line which supplies information to the control block as to the condition of the associated module.

Modes of Operation

Normal Mode

When the encoder controller 52 is in the normal mode of operation, it is searching for the occurrence of a failed module. Reference is now made to FIG. 9 which presents waveforms showing timing signals that are provided by the control block CB (FIG. 5) as well as the data that is obtained from the A/D converter 20. This information may be viewed in light of FIG. 10 which shows the signal path from the A/D converter 20 to the memory 50 during this mode of operation. The signal A/D CLOCK is a negative pulse that is supplied to the A/D converter 20 and occurs every 20 microseconds. The data appearing on the A/D DATA lines is valid after 15 microseconds from the occurrence of the A/D CLOCK. A DATA LATCHED pulse is provided during the valid data period and this is supplied to the D flip-flops 54A, 54B and 54C (making up the D flip-flop 54 in FIG. 3) so that the data from the A/D converter 20 can be latched into the flip-flops. This data is then supplied to the subtraction circuit 56 where the number of modules that are stuck on is subtracted from the number of modules that are to be turned on, as obtained from the A/D converter 20. This difference is then latched into the D flip-flops 58A, 58B, and 58C (making up the D flip-flop 58 of FIG. 3) under control of a DATA-ADJUSTED pulse supplied to the D flip-flop 58 from the controller 52. The output from the latched flip-flop 58 is now supplied to the memory 50 to obtain the turn on pattern for turning on the modules.

Figure 11:
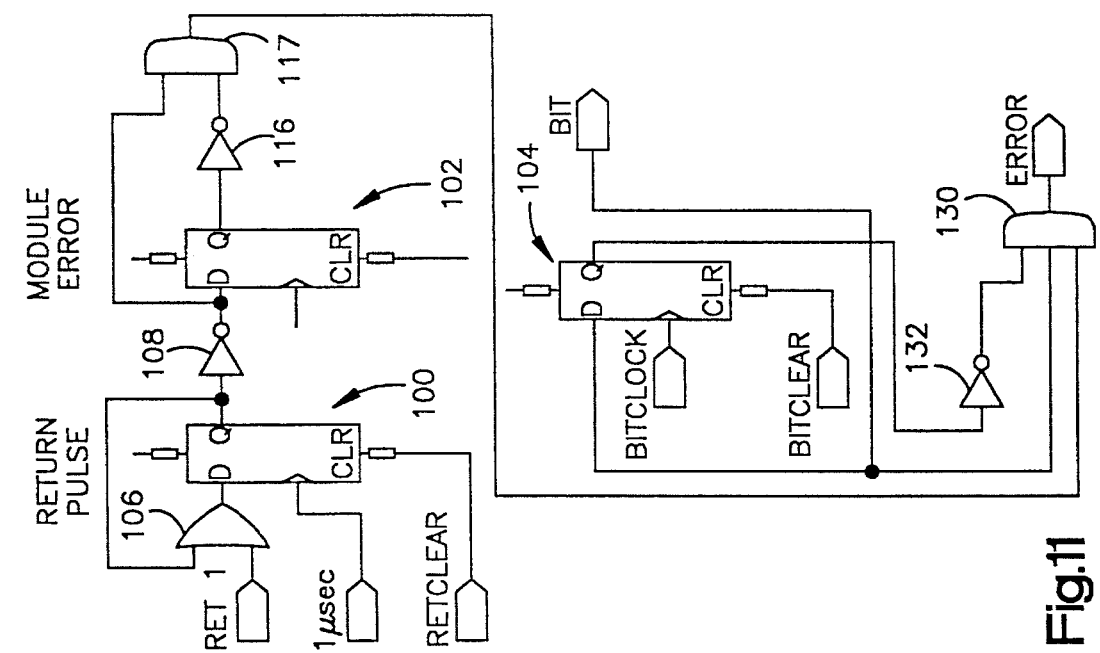
FIG. 11 is a schematic-block diagram showing a portion of the module cell of FIG. 6 which is used during the normal mode of operation.

Reference is now made to FIG. 11 which shows only those portions of the module cell of FIG. 8 that are employed during a normal mode of operation. The BIT line is connected to the associated EEPROM line. The module D flip-flop 104 stores the previous state of the module. If line BIT is one and the module D flip-flop 104 has an output of zero, then the module was just turned on. The RETURN PULSE flip-flop 100 is zero if its input line RET1 did not have a 2 microsecond return pulse. The module error D flip-flop 102 is at a zero state if the module has not failed. This condition will cause the signal ERROR at the output of AND gate 130 to be at a binary 1 level. The ERROR-CHECK pulse in FIG. 9 occurs 11 microseconds after the modules are turned on. This tells the control block CB that all of the return pulses from the modules should have occurred. If an error is detected, the control block will go into a module check mode of operation.

The return pulse flip-flop 100 will have a binary 1 status if a return pulse occurred during the proper period (see FIG. 4A). This will cause the module error flip-flop 102 to be at a binary 0 status. The state of the module is then stored in the module D flip-flop 104. The signal BIT CLOCK is a clock input to the flip-flop 104 so that it stores the value of the BIT line. In this manner, the encoder controller knows whether the module being examined is being turned on in the next clock period. If a module stays on from one clock period to the next, a return pulse is not expected. The signal RETCLEAR provided by the control block serves to clear the return flip-flop 100.

Module Check Mode

Figure 12:
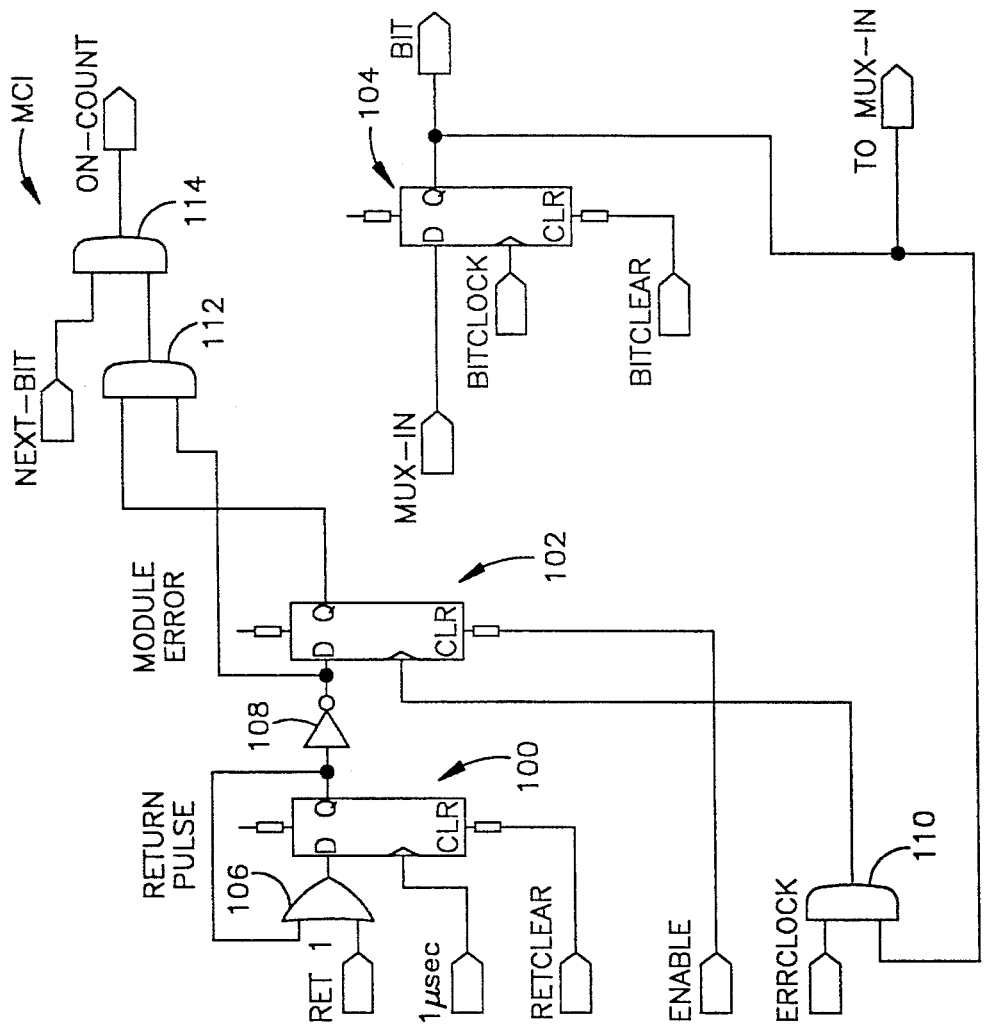
FIG. 12 is a schematic diagram showing a portion of the module cell during the module check mode of operation.
Figure 13:
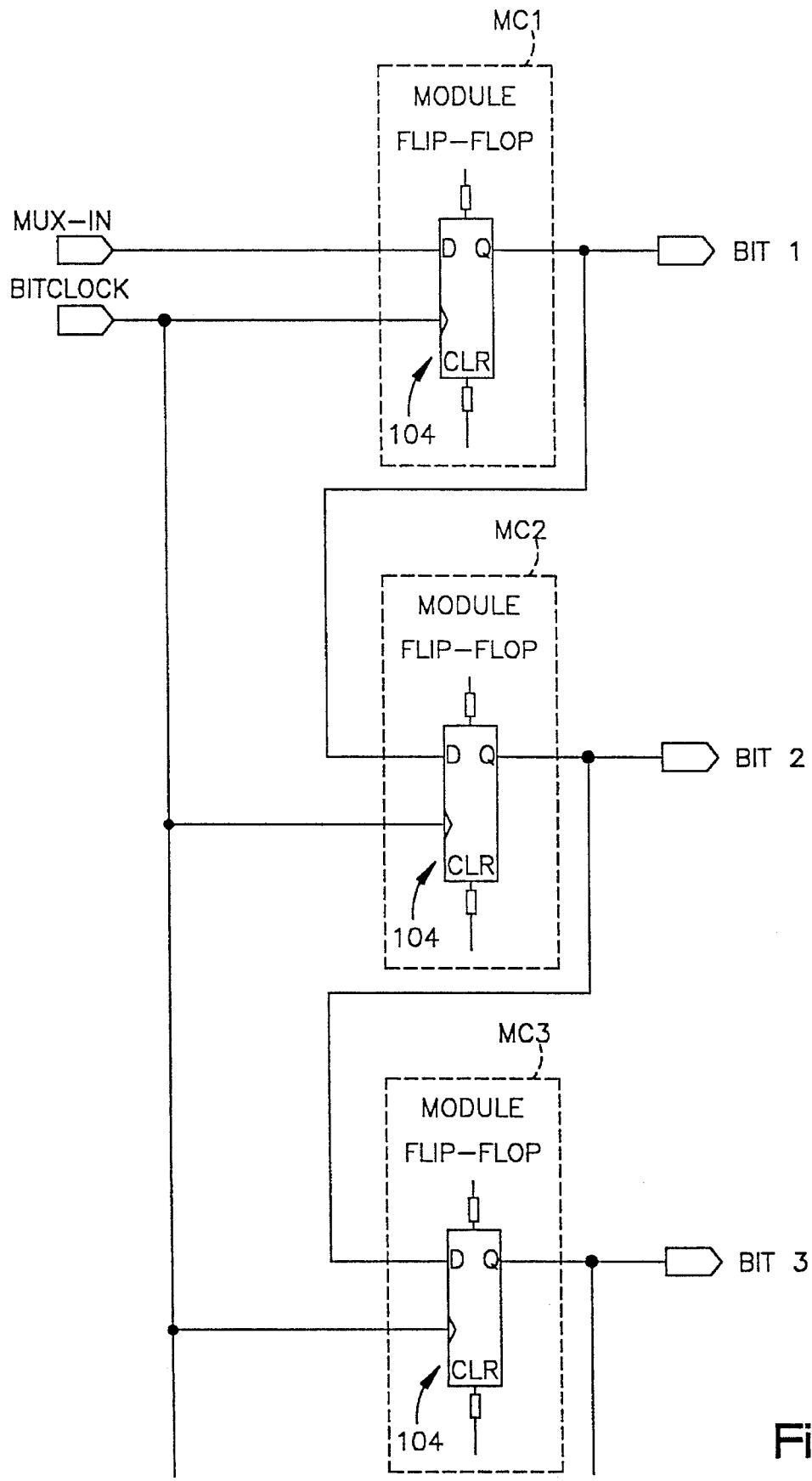
FIG. 13 is a schematic-block diagram illustration that shows the manner in which the module D flip-flops of the various module cells are interconnected during a module check mode of operation.

Reference is now made to FIG. 12 which shows a portion of the module cell of FIG. 8 that is employed during the module check mode of operation. When the encoder controller 52 detects an error, it checks each module to find the modules that are not working. FIG. 13 shows the manner in which the module cells are interconnected during this mode of operation. Thus, the module cells are interconnected in a stacked configuration with the BIT output from flip-flop 104 of each module being connected to the MUX-IN input of the next module and so on. The BIT CLOCK pulse is supplied to the clock input of each of the module flip-flops 104 in this stacked configuration.

Figure 14:
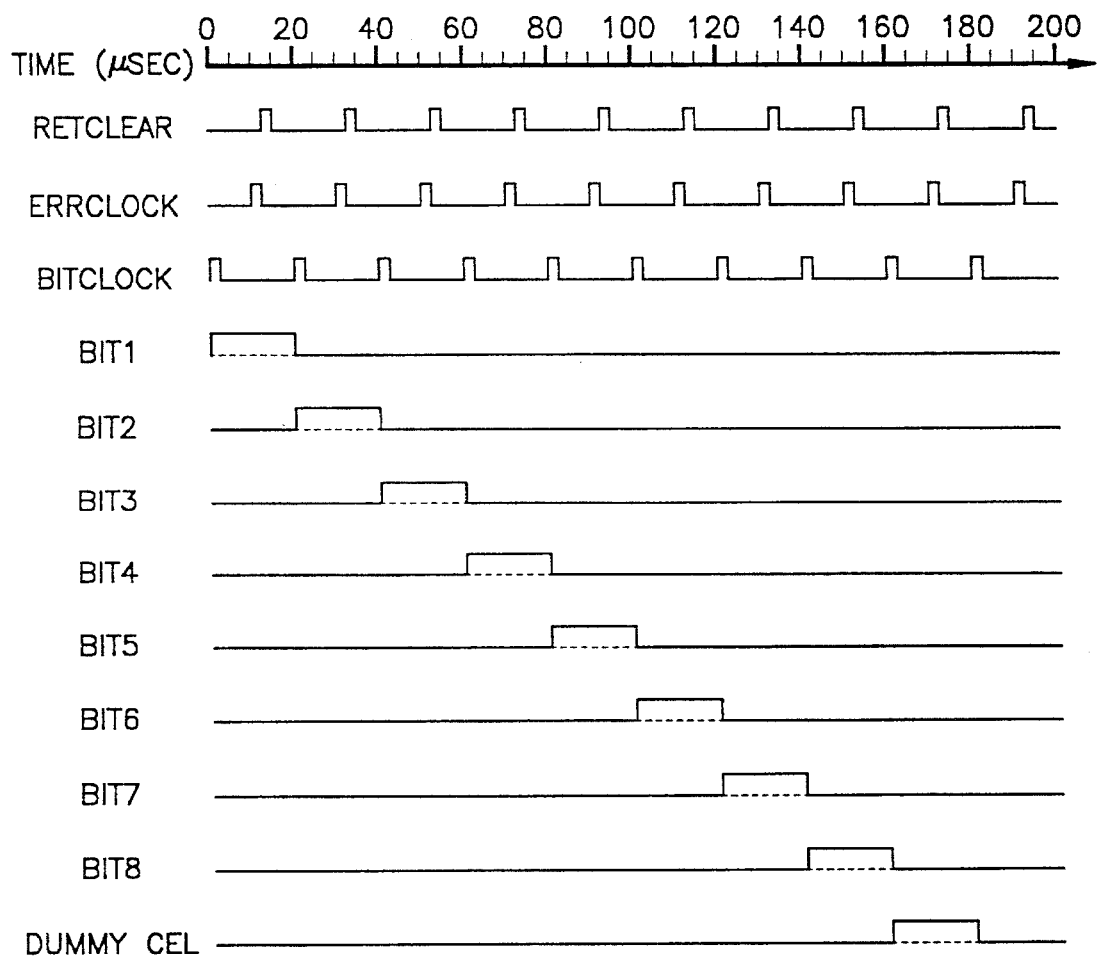
FIG. 14 includes graphical waveforms of voltage with respect to time useful in explaining the invention herein.

FIG. 14 is a graphical illustration of the timing signals provided by the control block CB during this mode of operation. BIT1 is the output of the module flip-flop 104 of module cell MC1. BIT2 is the output of the module flip-flop 104 of module cell MC2. The BIT1 pulse is used to turn on the first module M1. The BIT2 pulse is used to turn on the second module M2 and so. If module M1 is working, then it will send a return pulse back to the module cell MC1 after it has been turned on. This has been discussed hereinbefore with reference to the waveforms in FIGS. 4 and 7. A proper return pulse will set the return pulse flip-flop 100 in the associated module cell MC1 to a binary 1 level. The ERRCLOCK pulse (see FIG. 14) is supplied to the clock input of flip-flop 102 and, since the one output of flip-flop 100 is inverted by inverter amplifier 108, the flip-flop 102 will now be set so that its Q output is at a binary 0 level. This indicates that no error has taken place in module M1.

If module M1 is not working, then there will be no return pulse during the existence of the module drive signal (see FIGS. 4 and 7) and hence the return pulse flip-flop 100 in module MC1 will be set to a binary 0 level. This will cause the Q output of the module error flip-flop 102 to be at a binary 1 level. This indicates that a failure has taken place at module M1.

If a failure occurs in module M1, the type of failure that occurs will be determined while the next module, i.e., module M2, is turned on. In FIG. 12, the NEXT-BIT input is HIGH when module M2 is turned on. That is, the BIT output of module M1 is connected to the NEXT BIT input of the previous module, etc. If a return pulse occurs on line RET1 after module 1 is turned off, it means that module M1 is stuck off (see FIGS. 4 and 7). This causes the Q output of the return pulse flip flop 100 in module cell MC-1 to be at a binary 1 level. Since this is inverted by inverter amplifier 108, the ON-COUNT output of AND gate 114 will be 0. If no return pulse occurs on line RET1 after module M1 has been turned off this is interpreted that the module M1 is stuck on (see FIGS. 4 and 7). This will cause the Q output of the return pulse flip-flop 100 in module cell MC1 to be at a binary 0 level and the ON COUNT output of AND gate 114 will be at a binary 1 level. This indicates to the control block CB (FIG. 5) of the encoder controller that module M1 is stuck on. The ON-COUNT output lines of all of the module cells MC1 through MC8 are connected to the control block CB which includes a suitable counter for counting the number of modules that are stuck on during each sequence of interrogating the modules M1 through M8. This counter will be reset at the end of each sequence of interrogating the modules.

EEPROM Write Mode

The encoder controller 52 (FIG. 3) will rewrite the memory 50 in order to compensate for the failed modules. The data to be written into the memory 50 is obtained from the bi-directional lines of the encoder controller 52 and that data is written into an address that is supplied to the memory from the encoder controller 52 by way of the address counter 62 and the multiplexer 60. The encoder controller, during this operation, will disable the buffers B1 through B8 and will raise its EEPROM write signal which causes the data to be written into the memory at the addressed locations.

Figure 15:
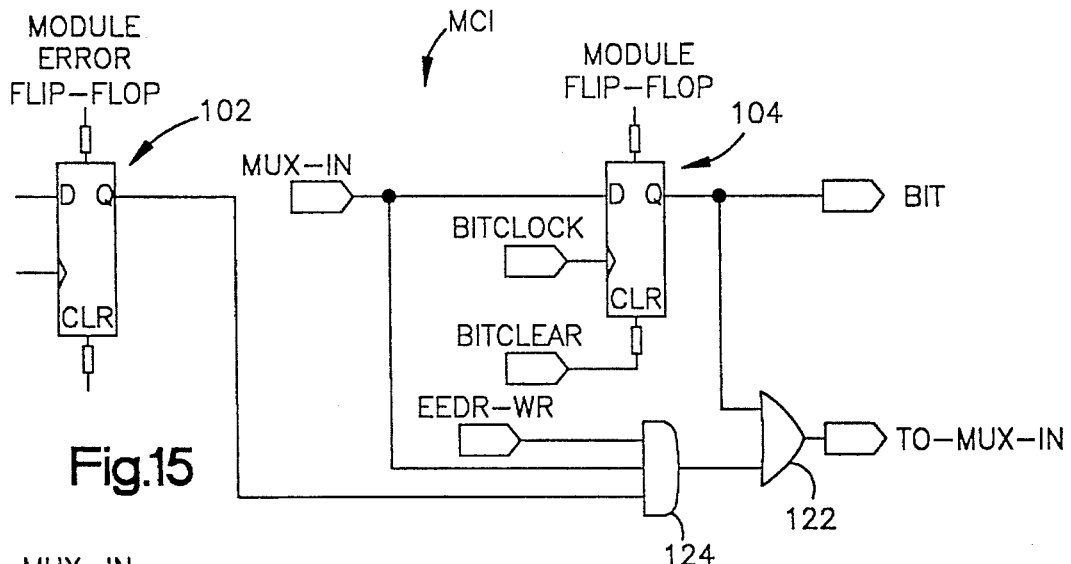
FIG. 15 is a schematic-block diagram illustrating a portion of the module cell operation during the EEPROM write mode of operation.
Figure 16:
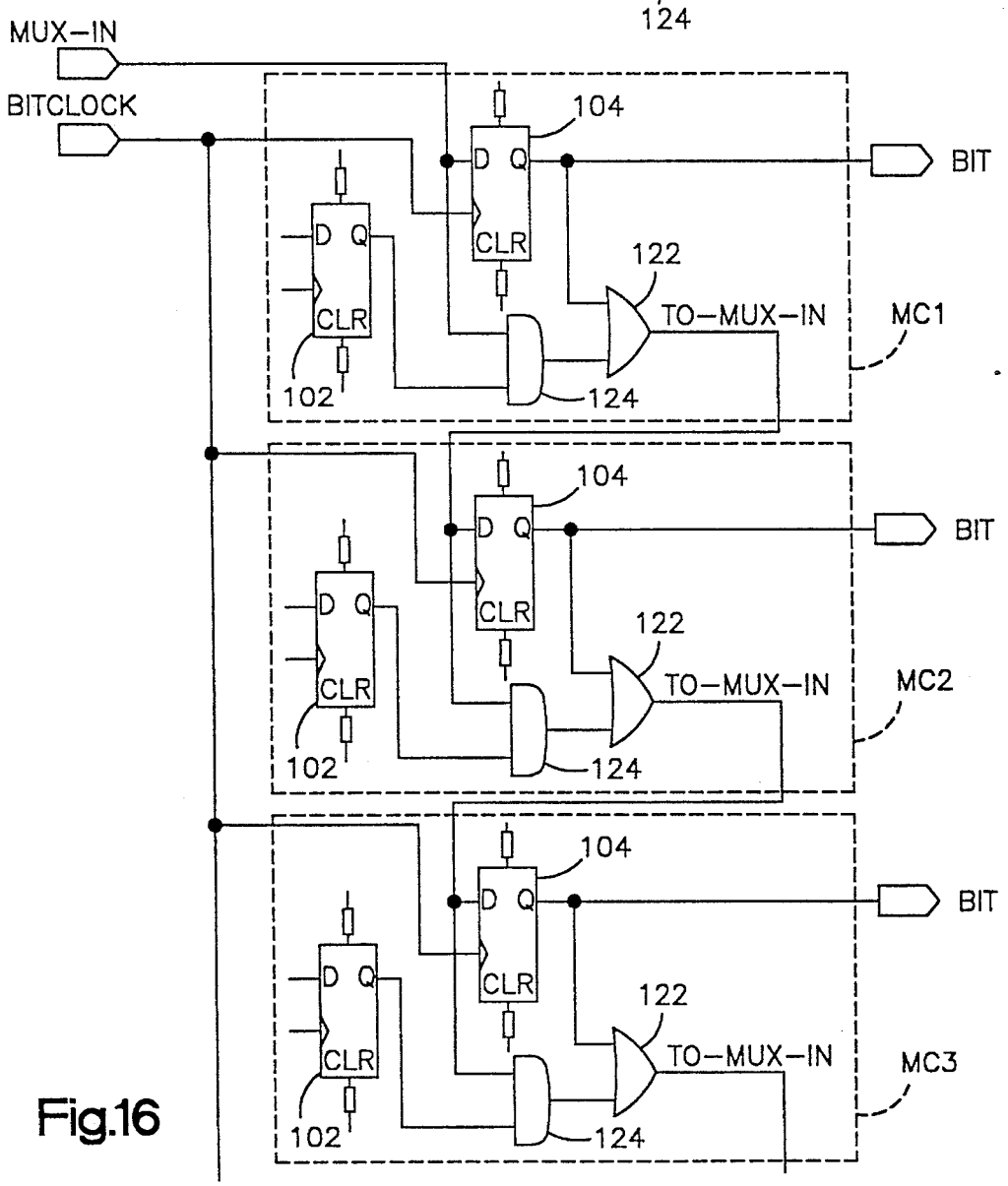
FIG. 16 illustrates the manner in which the module D flip-flops are interconnected during the EEPROM write mode of operation.
Figure 17:
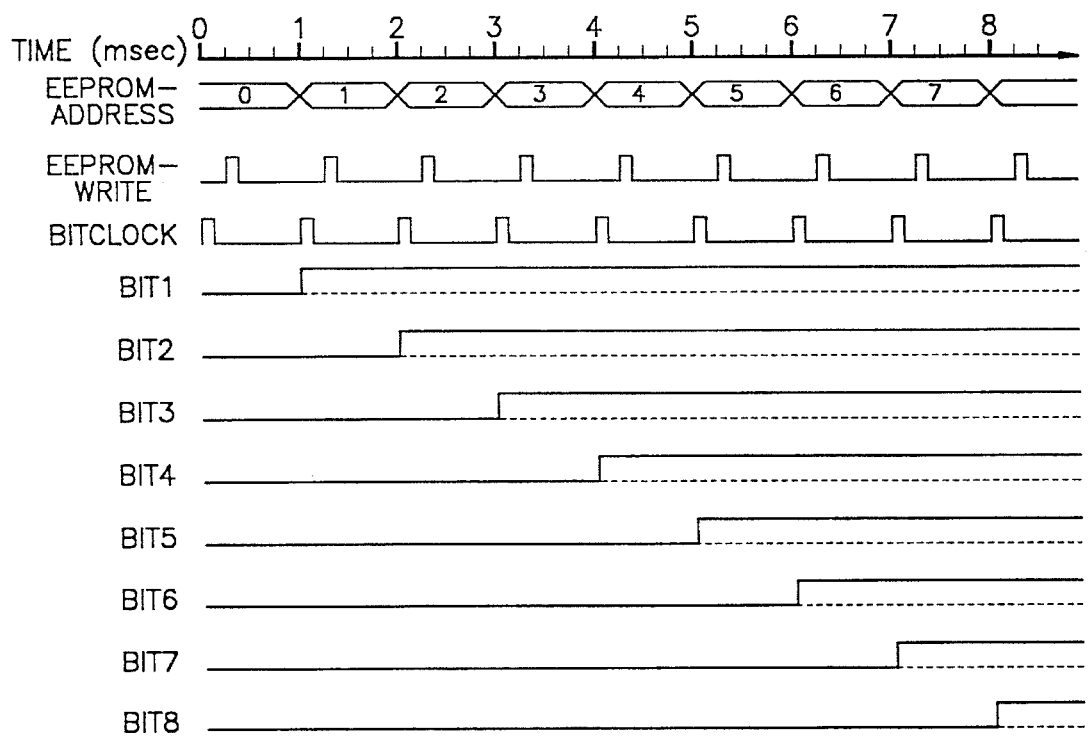
FIG. 17 includes graphical waveforms of voltage with respect to time useful in describing the portion of the invention relating to the EEPROM write mode of operation with no failed modules.

Reference is now made to FIG. 15 which illustrates that portion of the module cell MC1 that is used during the write mode of operation. The output TO-MUX-IN of FIG. 15 is connected to the MUX-IN of the next module cell MC2. This is shown in FIG. 16 wherein module cells MC1, MC2, MC3 are connected in a stacked configuration (it being understood that the remaining modules are also connected in the same manner). The input to the MUX-IN line of the first module cell MC1 is set by the control block CB. The write timing signals for the memory 50 for this mode of operation are obtained from the control block CB and are illustrated in FIG. 17 for the mode of operation when no modules have failed. Initially, the output signal level of the BIT1 line of the module cell MC1 is LOW. With the requested address being 0, then the output of all eight modules (BIT1 through BIT8) is 0. Therefore, when an EEPROM-WRITE pulse occurs, the number 00000000 is written into the memory at address 0. This takes less than a millisecond to accomplish. Next, the MUX-IN line to module cell MC1 goes HIGH. Consequently, a BITCLOCK pulse occurs and sets BIT1 line to 1 (HIGH). At this point, the address requested is address 1. Hence, as EEPROM-WRITE pulse causes the number 10000000 to be written into the memory at address 1. The next BIT CLOCK pulse causes the BIT2 line to go HIGH. Since the address requested is address 2, the pattern 11000000 is written into the memory at address 2. This process will continue until all eight addresses in the memory 50 have been written. The contents of the memory when this is completed takes the form as shown in Table I for each of the addresses.

Figure 18:
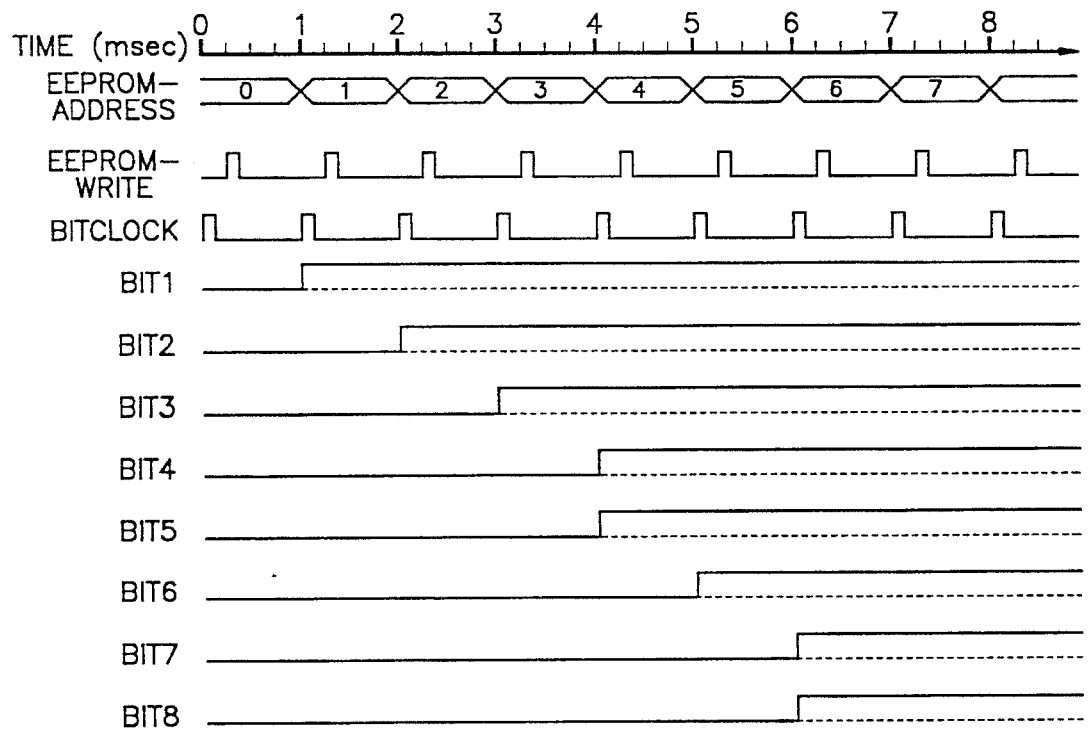
FIG. 18 includes graphical waveforms of voltage with respect to time useful in explaining the operation of the EEPROM write mode of operation when there are two failed modules.

If some of the modules M1 through M8 have failed, the data that is written into the memory 50 must compensate for the failed modules. Assume that modules 4 and 6 have failed. Consequently, the MODULE ERROR flip-flop 102 of module cells MC4 and MC6 have their Q outputs set to a binary 1 level before the memory write process begins. This process is illustrated in FIG. 18. Reference will now be made for the discussion that follows to both the timing signals in FIG. 18 for two failed modules as well as to the data stored in the memory as shown in Table II.

When the first EEPROM-WRITE pulse occurs, 0 (i.e., 00000000) is again written into the memory address 0 because all of the lines BIT1 through BIT8 are low. The MUX-IN line of module cell 1 goes HIGH and a BIT CLOCK pulse occurs. This sets BIT1 line to a binary level of 1. Consequently, then, EEPROM-WRITE pulse writes 10000000 into the memory address 1 because the only bit line that has been raised is BIT1 line. The next BIT CLOCK pulse sets line BIT2 to 1 and 1100 0000 is written into the memory address 2. After the next BIT CLOCK pulse, a binary pattern of 11100000 is written into the memory address 3. The next BIT CLOCK pulse sets both BIT4 and BIT5 lines to a binary 1 level. The BIT5 line is set to a binary 1 level because the module MC has failed. The MODULE ERROR flip-flop 102 of module cell MC4 is 1. This is illustrated in FIG. 15 which shows the circuitry in operation when the module is operating during the MEMORY WRITE mode. The EEPROM-WR (EEPROM-WRITE) signal is at a binary 1 level when in the EEPROM-WRITE mode of operation. With the module error flip-flop 102 having its Q output at a binary 1 level, the signal on the MUX-IN line will propagate to the next module cell. The result in the case being described is that the bit pattern 11111000 is written into the memory address 4. This process continues until all of the memory addresses have been written. The contents of the memory are as shown in Table II. The encoder will now revert to its normal operation of monitoring the modules M1 through M8 in the eight module example being described.

The pulse step modulator (PSM) illustrated in FIG. 1 serves to map information from the analog-to-digital converter 20 to the modules M1 through M(N). The output of converter 20 is a binary number which tells how many modules to turn on. The outputs of the modules are summed together to produce an output signal so it does not matter which module the encoder turns on. Thus, if the analog-to-digiital converter provides an output that requires that two modules be turned on, the encoder can turn on modules 1 and 2. It could also turn on modules 4 and 7 with the same resulting output. The adaptive encoder discussed herein determines which modules have failed and decides which modules to turn on.

Figure 19:
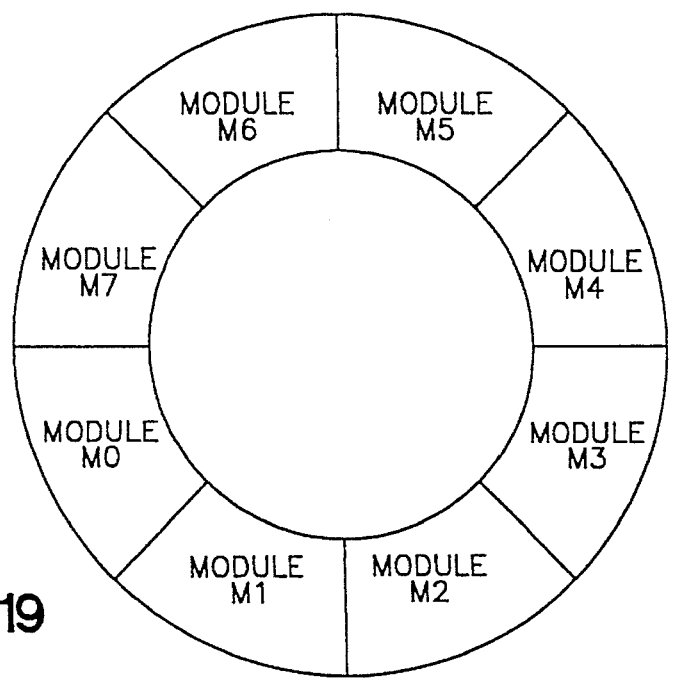
FIG. 19 is a graphical illustration of an inchworm pulse step modulator configuration.

Reference is now made to FIG. 19. This illustrates the operation which takes place with an inchworm encoder. Such a circuit serves to provide a first on-first off operation of the various modules. Thus, as the input signal increases in magnitude, the module that has been turned off for the longest will be the first to be turned on. Also, as the input signal decreases in magnitude, the module that has been turned on the longest will be the first to be turned off. In FIG. 19, there are eight modules illustrated with the modules being referred to as M0 through M7. The modules are shown in a circle for illustrative purposes. If five modules need to be turned on, modules M0, M1, M2, M3, and M4 are turned on. If six modules need to be turned on during the next time period, then modules M5, M6, M7, M0, M1 and M2 are turned on. If two modules need to be turned on during the next time period, then modules M3 and M4 are turned on. Using this technique, each module will be turned on the same amount of time.

Figure 20:
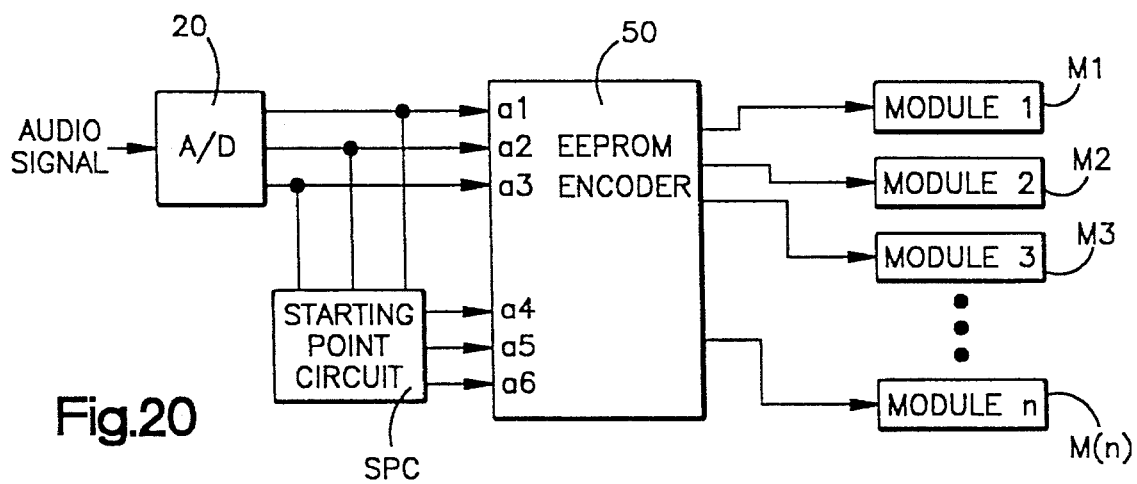
FIG. 20 is a block diagram illustration of a pulse step modulator system employing a starting point circuit in accordance with the present invention.

Reference is now made to FIG. 20 which is a simplified version of that illustrated in FIG. 3 but employing a starting point circuit SPC connected to the output of the analog-to-digital converter 20. The starting point circuit provides addresses to the EEPROM memory at address bits a4, a5, and a6. The outputs of the memory 50 are illustrated as being connected with the modules M1 through M(N). The encoder controller 52 and the other elements of FIG. 3 are not shown for purposes of simplification. The starting point circuit SPC, as will be described in greater detail hereinafter, determines the starting module for the modules that are to be turned on. This information is supplied as an address to address inputs a4, a5 and a6 of the memory 50, as will be described hereinafter. If some of the modules M1 through M(N) fail, then the memory 50 will be rewritten to compensate for the failed modules in a manner to be discussed hereinafter.

TABLE III

| \multicolumn{6}{c|}{Address} | \multicolumn{8}{c|}{Output} | \multicolumn{6}{c|}{Address} | \multicolumn{8}{c}{Output} |

| Address | | | | | | Output | | | | | | | | Address | | | | | | Output | | | | | | | |
|---|---|---|---|---|---|---|---|---|---|---|---|---|---|---|---|---|---|---|---|---|---|---|---|---|---|---|---|
| 6 | 5 | 4 | 3 | 2 | 1 | 0 | 1 | 2 | 3 | 4 | 5 | 6 | 7 | 6 | 5 | 4 | 3 | 2 | 1 | 0 | 1 | 2 | 3 | 4 | 5 | 6 | 7 |
| 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 1 | 1 | 0 | 0 | 0 | 0 | 0 | 0 | 0 | 1 | 0 | 0 | 0 | 0 | 1 | 0 | 0 | 0 | 0 | 1 | 0 | 0 | 0 |
| 0 | 0 | 0 | 0 | 1 | 0 | 1 | 1 | 0 | 0 | 0 | 0 | 0 | 0 | 1 | 0 | 0 | 0 | 1 | 0 | 0 | 0 | 0 | 0 | 1 | 1 | 0 | 0 |
| 0 | 0 | 0 | 0 | 1 | 1 | 1 | 1 | 1 | 0 | 0 | 0 | 0 | 0 | 1 | 0 | 0 | 0 | 1 | 1 | 0 | 0 | 0 | 0 | 1 | 1 | 1 | 0 |
| 0 | 0 | 0 | 1 | 0 | 0 | 1 | 1 | 1 | 1 | 0 | 0 | 0 | 0 | 1 | 0 | 0 | 1 | 0 | 0 | 0 | 0 | 0 | 0 | 1 | 1 | 1 | 1 |
| 0 | 0 | 0 | 1 | 0 | 1 | 1 | 1 | 1 | 1 | 1 | 0 | 0 | 0 | 1 | 0 | 0 | 1 | 0 | 1 | 1 | 0 | 0 | 0 | 1 | 1 | 1 | 1 |
| 0 | 0 | 0 | 1 | 1 | 0 | 1 | 1 | 1 | 1 | 1 | 1 | 0 | 0 | 1 | 0 | 0 | 1 | 1 | 0 | 1 | 1 | 0 | 0 | 1 | 1 | 1 | 1 |
| 0 | 0 | 0 | 1 | 1 | 1 | 1 | 1 | 1 | 1 | 1 | 1 | 1 | 0 | 1 | 0 | 0 | 1 | 1 | 1 | 1 | 1 | 1 | 0 | 1 | 1 | 1 | 1 |
| 0 | 0 | 1 | 0 | 0 | 0 | 0 | 0 | 0 | 0 | 0 | 0 | 0 | 0 | 1 | 0 | 1 | 0 | 0 | 0 | 0 | 0 | 0 | 0 | 0 | 0 | 0 | 0 |
| 0 | 0 | 1 | 0 | 0 | 1 | 0 | 1 | 0 | 0 | 0 | 0 | 0 | 0 | 1 | 0 | 1 | 0 | 0 | 1 | 0 | 0 | 0 | 0 | 0 | 1 | 0 | 0 |
| 0 | 0 | 1 | 0 | 1 | 0 | 0 | 1 | 1 | 0 | 0 | 0 | 0 | 0 | 1 | 0 | 1 | 0 | 1 | 0 | 0 | 0 | 0 | 0 | 0 | 1 | 1 | 0 |
| 0 | 0 | 1 | 0 | 1 | 1 | 0 | 1 | 1 | 1 | 0 | 0 | 0 | 0 | 1 | 0 | 1 | 0 | 1 | 1 | 0 | 0 | 0 | 0 | 0 | 1 | 1 | 1 |
| 0 | 0 | 1 | 1 | 0 | 0 | 0 | 1 | 1 | 1 | 1 | 0 | 0 | 0 | 1 | 0 | 1 | 1 | 0 | 0 | 1 | 0 | 0 | 0 | 0 | 1 | 1 | 1 |
| 0 | 0 | 1 | 1 | 0 | 1 | 0 | 1 | 1 | 1 | 1 | 1 | 0 | 0 | 1 | 0 | 1 | 1 | 0 | 1 | 1 | 1 | 0 | 0 | 0 | 1 | 1 | 1 |
| 0 | 0 | 1 | 1 | 1 | 0 | 0 | 1 | 1 | 1 | 1 | 1 | 1 | 0 | 1 | 0 | 1 | 1 | 1 | 0 | 1 | 1 | 1 | 0 | 0 | 1 | 1 | 1 |
| 0 | 0 | 1 | 1 | 1 | 1 | 0 | 1 | 1 | 1 | 1 | 1 | 1 | 1 | 1 | 0 | 1 | 1 | 1 | 1 | 1 | 1 | 1 | 1 | 0 | 1 | 1 | 1 |
| 0 | 1 | 0 | 0 | 0 | 0 | 0 | 0 | 0 | 0 | 0 | 0 | 0 | 0 | 1 | 1 | 0 | 0 | 0 | 0 | 0 | 0 | 0 | 0 | 0 | 0 | 0 | 0 |
| 0 | 1 | 0 | 0 | 0 | 1 | 0 | 0 | 1 | 0 | 0 | 0 | 0 | 0 | 1 | 1 | 0 | 0 | 0 | 1 | 0 | 0 | 0 | 0 | 0 | 0 | 1 | 0 |
| 0 | 1 | 0 | 0 | 1 | 0 | 0 | 0 | 1 | 1 | 0 | 0 | 0 | 0 | 1 | 1 | 0 | 0 | 1 | 0 | 0 | 0 | 0 | 0 | 0 | 0 | 1 | 1 |
| 0 | 1 | 0 | 0 | 1 | 1 | 0 | 0 | 1 | 1 | 1 | 0 | 0 | 0 | 1 | 1 | 0 | 0 | 1 | 1 | 1 | 0 | 0 | 0 | 0 | 0 | 1 | 1 |
| 0 | 1 | 0 | 1 | 0 | 0 | 0 | 0 | 1 | 1 | 1 | 1 | 0 | 0 | 1 | 1 | 0 | 1 | 0 | 0 | 1 | 1 | 0 | 0 | 0 | 0 | 1 | 1 |
| 0 | 1 | 0 | 1 | 0 | 1 | 0 | 0 | 1 | 1 | 1 | 1 | 1 | 0 | 1 | 1 | 0 | 1 | 0 | 1 | 1 | 1 | 1 | 0 | 0 | 0 | 1 | 1 |
| 0 | 1 | 0 | 1 | 1 | 0 | 0 | 0 | 1 | 1 | 1 | 1 | 1 | 1 | 1 | 1 | 0 | 1 | 1 | 0 | 1 | 1 | 1 | 1 | 0 | 0 | 1 | 1 |
| 0 | 1 | 0 | 1 | 1 | 1 | 1 | 0 | 1 | 1 | 1 | 1 | 1 | 1 | 1 | 1 | 0 | 1 | 1 | 1 | 1 | 1 | 1 | 1 | 1 | 0 | 1 | 1 |
| 0 | 1 | 1 | 0 | 0 | 0 | 0 | 0 | 0 | 0 | 0 | 0 | 0 | 0 | 1 | 1 | 1 | 0 | 0 | 0 | 0 | 0 | 0 | 0 | 0 | 0 | 0 | 0 |
| 0 | 1 | 1 | 0 | 0 | 1 | 0 | 0 | 0 | 1 | 0 | 0 | 0 | 0 | 1 | 1 | 1 | 0 | 0 | 1 | 0 | 0 | 0 | 0 | 0 | 0 | 0 | 1 |
| 0 | 1 | 1 | 0 | 1 | 0 | 0 | 0 | 0 | 1 | 1 | 0 | 0 | 0 | 1 | 1 | 1 | 0 | 1 | 0 | 1 | 0 | 0 | 0 | 0 | 0 | 0 | 1 |
| 0 | 1 | 1 | 0 | 1 | 1 | 0 | 0 | 0 | 1 | 1 | 1 | 0 | 0 | 1 | 1 | 1 | 0 | 1 | 1 | 1 | 1 | 0 | 0 | 0 | 0 | 0 | 1 |
| 0 | 1 | 1 | 1 | 0 | 0 | 0 | 0 | 0 | 1 | 1 | 1 | 1 | 0 | 1 | 1 | 1 | 1 | 0 | 0 | 1 | 1 | 1 | 0 | 0 | 0 | 0 | 1 |
| 0 | 1 | 1 | 1 | 0 | 1 | 0 | 0 | 0 | 1 | 1 | 1 | 1 | 1 | 1 | 1 | 1 | 1 | 0 | 1 | 1 | 1 | 1 | 1 | 0 | 0 | 0 | 1 |
| 0 | 1 | 1 | 1 | 1 | 0 | 1 | 0 | 0 | 1 | 1 | 1 | 1 | 1 | 1 | 1 | 1 | 1 | 1 | 0 | 1 | 1 | 1 | 1 | 1 | 0 | 0 | 1 |
| 0 | 1 | 1 | 1 | 1 | 1 | 1 | 1 | 0 | 1 | 1 | 1 | 1 | 1 | 1 | 1 | 1 | 1 | 1 | 1 | 1 | 1 | 1 | 1 | 1 | 1 | 0 | 1 |

Figure 21:
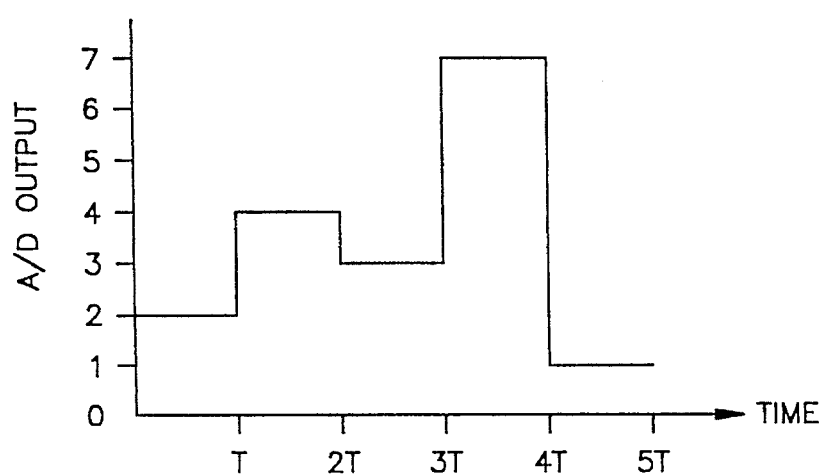
FIG. 21 is a graphical illustration of amplitude with respect to time useful in describing the invention herein.
Figure 22:
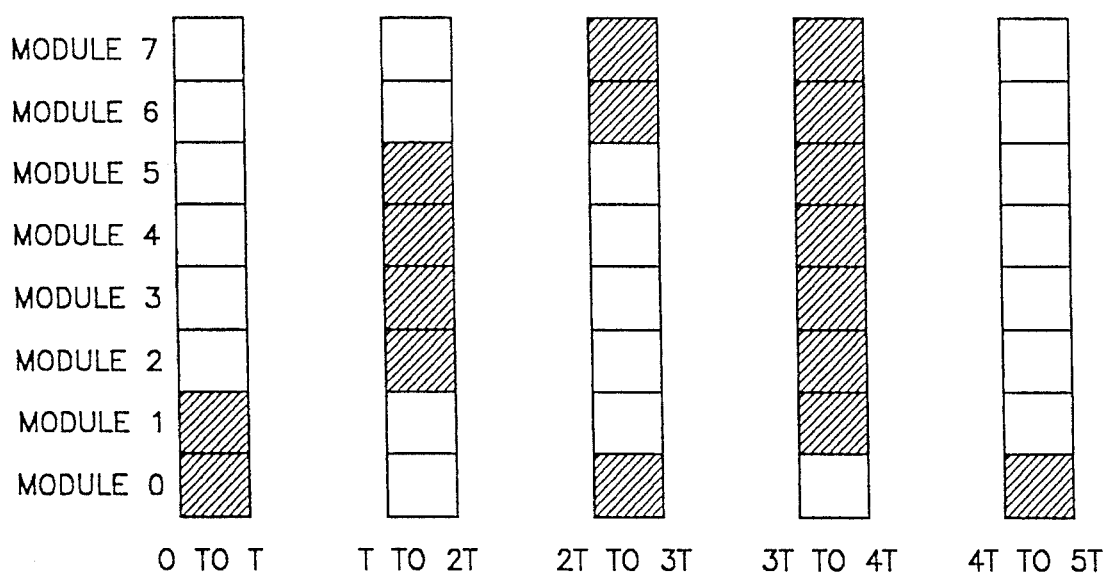
FIG. 22 is a series of bar graphs showing the various modules that are turned on with cross-hatch indications over five different time intervals corresponding with that of FIG. 21.

FIGS. 21 and 22 present an example of an inchworm encoder with eight modules with various outputs from the analog-to-digital converter 20 requesting that various modules be turned on. Table III shows the contents of memory 50 that is used to turn on the modules when properly addressed. Address bits 1, 2 and 3 are obtained from the analog to digital converter 20 (FIG. 3). An analog-to-digital converter output of 6 corresponds to a memory address of XXX110. X stands for a don't care condition. Address bits 4, 5 and 6 come from the starting point circuit SPC. If the output from the starting point circuit is 6, this corresponds to a memory address of 110XXX. The memory 50 (FIG. 3) has eight data outputs d1 through d8. These output lines of the memory are connected through buffers to modules M1 through M8 in the example presented herein. If the memory 50 has an output pattern of 01001100, this will turn on modules 1, 4 and 5. Similarly, a memory output of 11110000 would turn on modules 0, 1, 2 and 3 only. Also, for example, a memory output of 00001111 would turn on only modules 4, 5, 6 and 7.

Reference is now made specifically to FIGS. 21 and 22 Table III. During the first time period 0 to T, the output of the analog-to-digital converter 20 is 2. This commands that two modules be turned on. Initially, the output of the starting point circuit SPC is 0 indicating that the first module to be turned on is module M0 (see FIG. 19). Since the output of the converter 20 is 2, this will produce an address of 000 010. As shown in Table III, this will produce an output from memory 50 of 1100 0000. As indicated by the legend output at the top of Table III, the output from this address turns on modules 0 and 1.

During each calculation of a starting point, the starting point circuit SPC takes the previous starting point and adds the number of modules that are to be turned on. The result is the starting point during the next time period. If this number is equal to or greater than 8, then 8 is subtracted from it.

In the example being presented, the next starting point is calculated by adding the number of modules that are to be turned on (2) to the previous starting point (0). This produces the next starting point of 2. This is shown in the second column in FIG. 22.

During this next time period, from time T to time 2T, the output of the analog-to-digital converter 20 is 4. The output of the starting point circuit is 2 so that the address is 2 plus 4, or 010 100. From Table III it is seen that the output of the memory for this address is 0011 1100. From this it is seen that modules 2, 3, 4 and 5 will be turned on. Consequently, the starting point circuit will now calculate the starting point for the next time period by adding 4 to 2 to obtain 6 (or a bit pattern of 110 for the starting point portion of the address).

During the next time period from time 2T to time 3T, it is seen from FIG. 21 that the output of the analog-to-digital converter 20 is 3. Three represents a bit pattern of 011. Since the starting point address is 6 (bit pattern 110), the entire address for the memory will be 110 011. From Table III the output of memory 50 for this address is 1000 0011. From this bit pattern it is seen from Table III that modules 6, 7 and 0 will be turned on. The starting point circuit will now find the starting point for the next time period. To accomplish this, the output 3 of the analog-to-digital converter is added to the previous starting point of 6. The result is 9 so 8 is subtracted from 9 to obtain the next starting point of 1.

During the next time period from time 3T to time 4T (FIGS. 21 and 22), the output of the analog-to-digital converter 20 is 7. The output of the starting point circuit SPC is 1 so that the address is 001 111. From Table III it is seen that the output of memory 50 will be 0111 1111. This will turn on modules 1 through 7. To find the starting point for the next time period, the number of modules that have been turned on (7) is added to the last or previous starting point (1). The result is 8. Thus 8 is subtracted from 8 to produce the next starting point of 0.

During the next time period from time 4T to time 5T, the output of the analog-to-digital converter 20 is 1 (see FIGS. 21 and 22). The output of the starting point circuit SPC is 0 so that the address is 000 001. From Table III it is seen that for this address the output of memory 50 is 1000 0000. This turns on module M0.

Two Failed Modules

Figure 23:
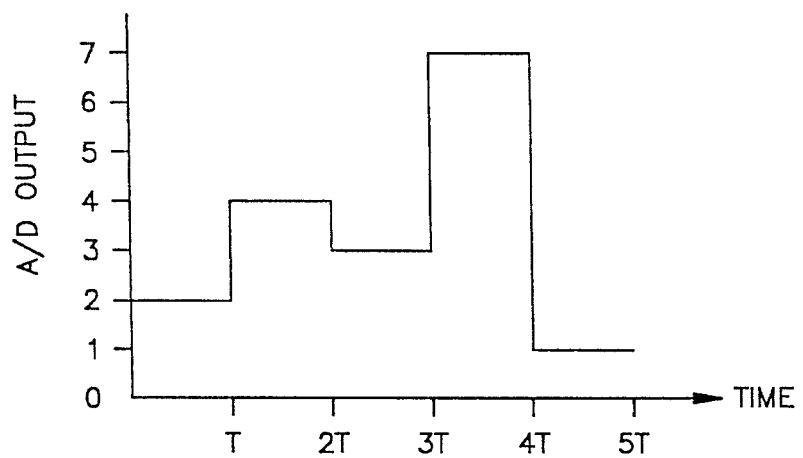
FIG. 23 is a graphical illustration similar to that shown in FIG. 21 and is useful in conjunction with the description associated with FIG. 24.
Figure 24:
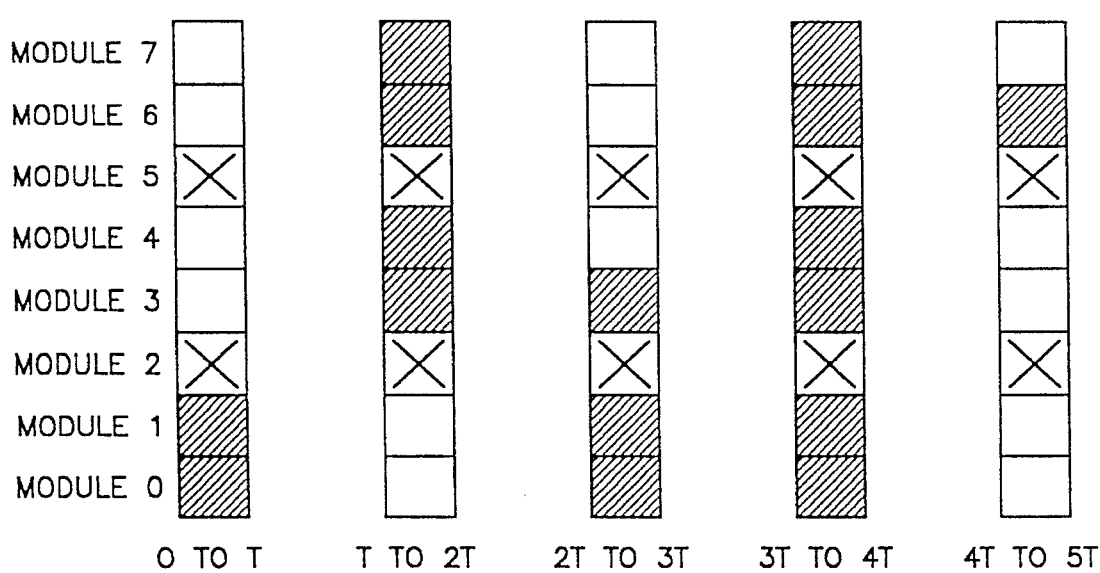
FIG. 24 is a showing of bar graphs similar to that of FIG. 22 but illustrating the operation that takes place when two modules (modules 2 and 5) have failed.

Reference is now made to Table IV, below, and to FIGS. 23 and 24. FIGS. 23 and 24 correspond respectively with FIGS. 21 and 22 discussed earlier and represent an example of an inchworm encoder operation wherein modules 2 and 5 have failed.

point circuit will continue to compute the next starting point by taking the previous starting point and adding the number of modules that have been turned on. However, if the result is equal to or greater than 6, then six is subtracted from the result. In the example being presented, 2 is added to 0 to produce the next starting point of 2.

During the next time period from time T to time 2T the output from the analog-to-digital converter 20 is 4. The output of the starting point circuit is 2 and, consequently, the address is 010 100. As noted from Table IV, the output of memory 50 for this condition is 00X1 1X11. Consequently, as seen from Table IV, modules 3, 4, 6 and 7 are turned on. In order to determine the starting point for the next time period, 4 is added to 2. The result is 6 and 6 is subtracted from the result to produce the next starting point of 0.

During the next time period from time 2T to time 3T, the output of the analog-to-digital converter 50 is 3. The output of the starting point circuit is 0 so that the address is 000 011.

TABLE IV

| Address | | | | | | Output | | | | | | | | Address | | | | | | Output | | | | | | | |
|---|---|---|---|---|---|---|---|---|---|---|---|---|---|---|---|---|---|---|---|---|---|---|---|---|---|---|---|
| 6 | 5 | 4 | 3 | 2 | 1 | 0 | 1 | 2 | 3 | 4 | 5 | 6 | 7 | 6 | 5 | 4 | 3 | 2 | 1 | 0 | 1 | 2 | 3 | 4 | 5 | 6 | 7 |
| 0 | 0 | 0 | 0 | 0 | 0 | 0 | 0 | X | 0 | 0 | X | 0 | 0 | 1 | 0 | 0 | 0 | 0 | 0 | 0 | 0 | X | 0 | 0 | X | 0 | 0 |
| 0 | 0 | 0 | 0 | 0 | 1 | 1 | 0 | X | 0 | 0 | X | 0 | 0 | 1 | 0 | 0 | 0 | 0 | 1 | 0 | 0 | X | 0 | 0 | X | 1 | 0 |
| 0 | 0 | 0 | 0 | 1 | 0 | 1 | 1 | X | 0 | 0 | X | 0 | 0 | 1 | 0 | 0 | 0 | 1 | 0 | 0 | 0 | X | 0 | 0 | X | 1 | 1 |
| 0 | 0 | 0 | 0 | 1 | 1 | 1 | 1 | X | 1 | 0 | X | 0 | 0 | 1 | 0 | 0 | 0 | 1 | 1 | 1 | 0 | X | 0 | 0 | X | 1 | 1 |
| 0 | 0 | 0 | 1 | 0 | 0 | 1 | 1 | X | 1 | 1 | X | 0 | 0 | 1 | 0 | 0 | 1 | 0 | 0 | 1 | 1 | X | 0 | 0 | X | 1 | 1 |
| 0 | 0 | 0 | 1 | 0 | 1 | 1 | 1 | X | 1 | 1 | X | 1 | 0 | 1 | 0 | 0 | 1 | 0 | 1 | 1 | 1 | X | 1 | 0 | X | 1 | 1 |
| 0 | 0 | 0 | 1 | 1 | 0 | 1 | 1 | X | 1 | 1 | X | 1 | 1 | 1 | 0 | 0 | 1 | 1 | 0 | 1 | 1 | X | 1 | 1 | X | 1 | 1 |
| 0 | 0 | 0 | 1 | 1 | 1 | 1 | 1 | X | 1 | 1 | X | 1 | 1 | 1 | 0 | 0 | 1 | 1 | 1 | 1 | 1 | X | 1 | 1 | X | 1 | 1 |
| 0 | 0 | 1 | 0 | 0 | 0 | 0 | 0 | X | 0 | 0 | X | 0 | 0 | 1 | 0 | 1 | 0 | 0 | 0 | 0 | 0 | X | 0 | 0 | X | 0 | 0 |
| 0 | 0 | 1 | 0 | 0 | 1 | 0 | 1 | X | 0 | 0 | X | 0 | 0 | 1 | 0 | 1 | 0 | 0 | 1 | 0 | 0 | X | 0 | 0 | X | 0 | 1 |
| 0 | 0 | 1 | 0 | 1 | 0 | 0 | 1 | X | 1 | 0 | X | 0 | 0 | 1 | 0 | 1 | 0 | 1 | 0 | 1 | 0 | X | 0 | 0 | X | 0 | 1 |
| 0 | 0 | 1 | 0 | 1 | 1 | 0 | 1 | X | 1 | 1 | X | 0 | 0 | 1 | 0 | 1 | 0 | 1 | 1 | 1 | 1 | X | 0 | 0 | X | 0 | 1 |
| 0 | 0 | 1 | 1 | 0 | 0 | 0 | 1 | X | 1 | 1 | X | 1 | 0 | 1 | 0 | 1 | 1 | 0 | 0 | 1 | 1 | X | 1 | 0 | X | 0 | 1 |
| 0 | 0 | 1 | 1 | 0 | 1 | 0 | 1 | X | 1 | 1 | X | 1 | 1 | 1 | 0 | 1 | 1 | 0 | 1 | 1 | 1 | X | 1 | 1 | X | 0 | 1 |
| 0 | 0 | 1 | 1 | 1 | 0 | 1 | 1 | X | 1 | 1 | X | 1 | 1 | 1 | 0 | 1 | 1 | 1 | 0 | 1 | 1 | X | 1 | 1 | X | 1 | 1 |
| 0 | 0 | 1 | 1 | 1 | 1 | 1 | 1 | X | 1 | 1 | X | 1 | 1 | 1 | 0 | 1 | 1 | 1 | 1 | 1 | 1 | X | 1 | 1 | X | 1 | 1 |
| 0 | 1 | 0 | 0 | 0 | 0 | 0 | 0 | X | 0 | 0 | X | 0 | 0 | 1 | 1 | 0 | 0 | 0 | 0 | X | X | X | X | X | X | X | X |
| 0 | 1 | 0 | 0 | 0 | 1 | 0 | 0 | X | 1 | 0 | X | 0 | 0 | 1 | 1 | 0 | 0 | 0 | 1 | X | X | X | X | X | X | X | X |
| 0 | 1 | 0 | 0 | 1 | 0 | 0 | 0 | X | 1 | 1 | X | 0 | 0 | 1 | 1 | 0 | 0 | 1 | 0 | X | X | X | X | X | X | X | X |
| 0 | 1 | 0 | 0 | 1 | 1 | 0 | 0 | X | 1 | 1 | X | 1 | 0 | 1 | 1 | 0 | 0 | 1 | 1 | X | X | X | X | X | X | X | X |
| 0 | 1 | 0 | 1 | 0 | 0 | 0 | 0 | X | 1 | 1 | X | 1 | 1 | 1 | 1 | 0 | 1 | 0 | 0 | X | X | X | X | X | X | X | X |
| 0 | 1 | 0 | 1 | 0 | 1 | 1 | 1 | X | 1 | 1 | X | 1 | 1 | 1 | 1 | 0 | 1 | 0 | 1 | X | X | X | X | X | X | X | X |
| 0 | 1 | 0 | 1 | 1 | 0 | 1 | 1 | X | 1 | 1 | X | 1 | 1 | 1 | 1 | 0 | 1 | 1 | 0 | X | X | X | X | X | X | X | X |
| 0 | 1 | 0 | 1 | 1 | 1 | 1 | 1 | X | 1 | 1 | X | 1 | 1 | 1 | 1 | 0 | 1 | 1 | 1 | X | X | X | X | X | X | X | X |
| 0 | 1 | 1 | 0 | 0 | 0 | 0 | 0 | X | 0 | 0 | X | 0 | 0 | 1 | 1 | 1 | 0 | 0 | 0 | X | X | X | X | X | X | X | X |
| 0 | 1 | 1 | 0 | 0 | 1 | 0 | 0 | X | 0 | 1 | X | 0 | 0 | 1 | 1 | 1 | 0 | 0 | 1 | X | X | X | X | X | X | X | X |
| 0 | 1 | 1 | 0 | 1 | 0 | 0 | 0 | X | 0 | 1 | X | 1 | 0 | 1 | 1 | 1 | 0 | 1 | 0 | X | X | X | X | X | X | X | X |
| 0 | 1 | 1 | 0 | 1 | 1 | 0 | 0 | X | 0 | 1 | X | 1 | 1 | 1 | 1 | 1 | 0 | 1 | 1 | X | X | X | X | X | X | X | X |
| 0 | 1 | 1 | 1 | 0 | 0 | 1 | 0 | X | 0 | 1 | X | 1 | 1 | 1 | 1 | 1 | 1 | 0 | 0 | X | X | X | X | X | X | X | X |
| 0 | 1 | 1 | 1 | 0 | 1 | 1 | 1 | X | 1 | 1 | X | 1 | 1 | 1 | 1 | 1 | 1 | 0 | 1 | X | X | X | X | X | X | X | X |
| 0 | 1 | 1 | 1 | 1 | 0 | 1 | 1 | X | 1 | 1 | X | 1 | 1 | 1 | 1 | 1 | 1 | 1 | 0 | X | X | X | X | X | X | X | X |
| 0 | 1 | 1 | 1 | 1 | 1 | 1 | 1 | X | 1 | 1 | X | 1 | 1 | 1 | 1 | 1 | 1 | 1 | 1 | X | X | X | X | X | X | X | X |

Table IV is a Table that shows the content of memory 50 used to turn on the modules. The memory has been rewritten to compensate for the failed modules. The rewriting of the memory is patterned after that discussed hereinbefore with reference to Table II and the discussion relative to FIGS. 16–18. During the first time period from time 0 to time T, the output of the analog-to-digital converter 20 is 2. The output from the starting point circuit SPC is 0. This produces an address of 000 010. The output from memory 50 as shown in Table IV for this address is 11X0 0X00. An X indicates a don't care condition. From Table IV, this output indicates that modules M0 and M1 are turned on. Since modules M2 and M5 have failed, the memory 50 can not be employed to turn them on.

The starting point circuit SPC is adjusted, as will be described hereinafter, due to the failed modules. The starting From Table IV it is seen that the output of memory 50 for this condition is 11X1 0X00. Thus, modules 0, 1 and 3 are turned on. In order to determine the starting point for the next time period, 3 is added to 0.

During the next time period from time 3T to time 4T, the output of the analog-to-digital converter 50 is 7. The output of the starting point circuit is 3 and the address is 011 111. From Table IV the output of memory 50 for this condition is 11X1 1X11. Thus, modules 0, 1, 3, 4 6 and 7 are turned on. That is, only six modules can be turned on. To find the next starting point for the next time period, 7 is added to 3. The result is 10 and 6 is subtracted from the result to produce the next starting point of 4.

During the next time period from time 4T to time 5T, the output of the analog-to-digital converter is 1. The output of the starting point circuit SPC is 4. Thus, the address is 100

001. From Table IV it is seen that the output of memory 50 for this condition is 00X0 0X10. Consequently, only module 6 is turned on.

Starting Point Circuit

Figure 25:
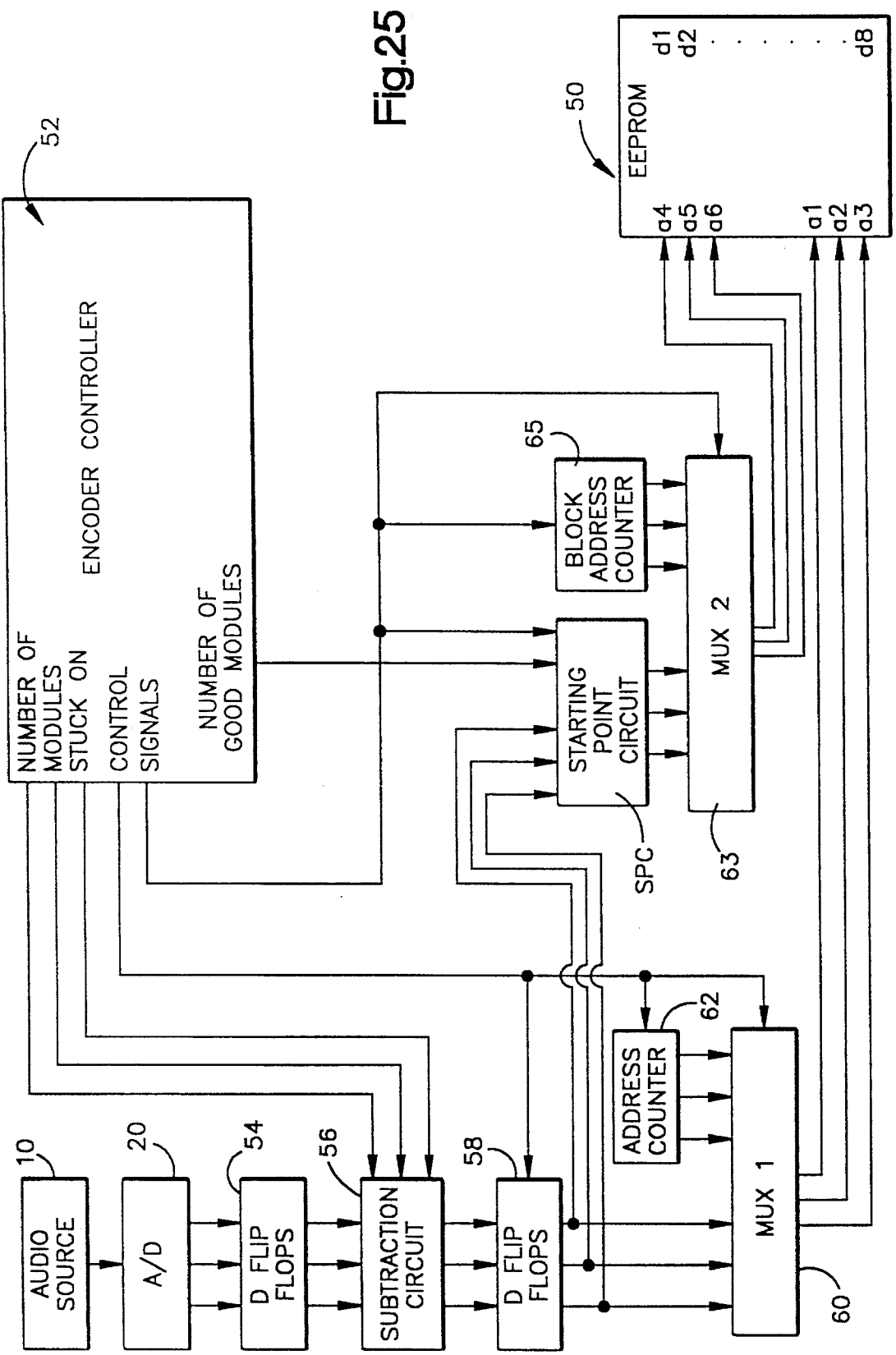
FIG. 25 is a schematic-block diagram illustration similar to that of FIG. 3 but including a starting point circuit constructed in accordance with the present invention.

Reference is now made to FIGS. 25–29 which illustrate circuitry and waveforms dealing with the modifications involving the starting point circuit SPC discussed hereinabove. FIG. 25 illustrates the changes to be made to FIG. 3 to include the starting point circuit and the associated circuitry. Thus, a starting point circuit SPC is connected between the D flip-flops 58 and a second multiplexer 63. The inputs to the starting point circuit include the outputs from the D flip-flops 58 as well as an output from the encoder controller and which provides the number of good modules. This may be achieved by subtracting the number of bad modules from the total number of modules by suitable subtraction circuitry within the encoder controller 52. Another input into the multiplexer 63 is obtained from a block address counter 65 that is also employed during the writing of the memory 50. The address counter 62 is also employed during the writing of the memory 50, as will be discussed hereinafter.

As in the embodiment of FIG. 3, the multiplexer 60 provides a three-bit address that is supplied to inputs a1, a2, a3 of memory 50. This provides the number of modules that are to be turned on. The starting point address is the second portion of the address and it is obtained from multiplexer 63 and is a three-bit address which is applied to memory inputs a4, a5 and a6. The six-bit addresses and the outputs obtained from the memory are shown in Table IV, which has been discussed hereinabove.

Figure 26:
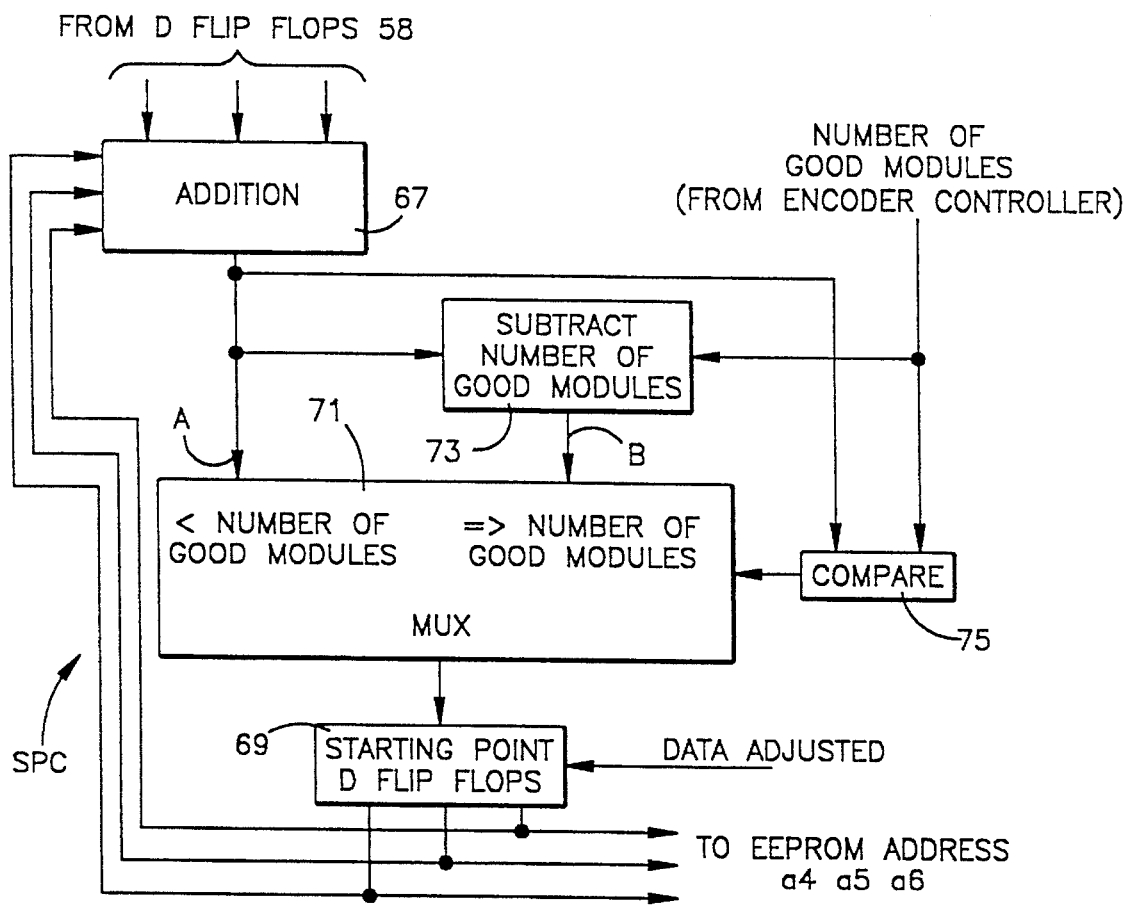
FIG. 26 is a schematic-block diagram illustration of the starting point circuit employed in FIG. 25.
Figure 27:
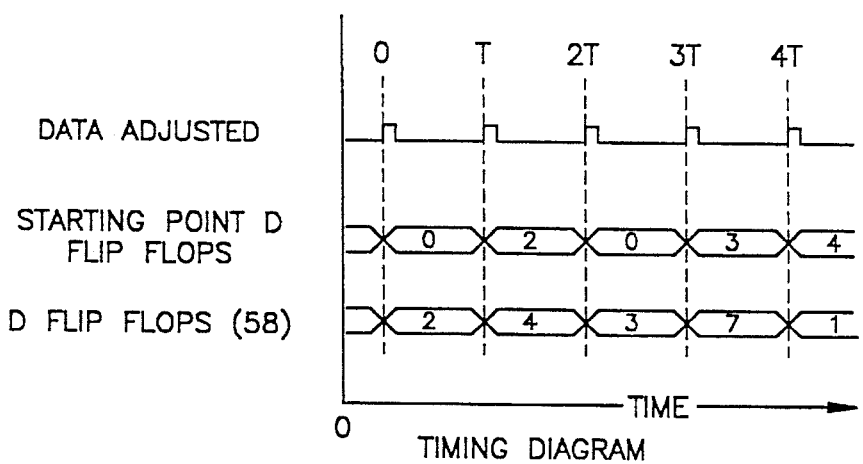
FIG. 27 includes graphical waveforms of voltage with respect to time useful in describing a portion of the invention relating to FIGS. 25 and 26.

The starting point circuit SPC is shown in detail in FIG. 26 to which attention is now directed. The outputs from the D flip-flops 58 are supplied to an addition circuit 67. The number received from the D flip-flops is representative of the number of modules to be turned on. This number is added to the last starting point address which is obtained from starting point D flip-flops 69 and supplied to the memory addresses a4, a5 and a6 by way of the second multiplexer 63. This output is also supplied as a second input to the addition circuit 67. The output of the addition circuit is supplied to the A input of a multiplexer 71 as well as into a subtraction circuit 73. The number of good modules is also supplied to subtraction circuit 73 and the difference is supplied to the B input of multiplexer 71. The output from the addition circuit 67 and the number of good modules are supplied to a comparator 75 which selects either the A input or the B input to be routed through the multiplexer to the starting point D flip-flops 69. The timing diagram of FIG. 27 may be referred to when considering the discussion that follows.

In the discussion given previously, it has been assumed that modules 2 and 5 have failed and that the output of the analog-to-digital converter 20 takes the form as shown in FIGS. 21 and 23. The discussion that follows illustrates how the starting point circuitry functions to achieve the operation as shown in FIG. 24.

The first input from the D flip-flops 58 (see FIGS. 3 and 25) is 2. The starting point D flip-flops 69 initially provide an output of 0 (see the timing diagram of FIG. 27). Consequently, the output to the memory 50 during the time period from time 0 to time T (see FIGS. 23 and 24) is 0 and 2

The output of the starting point D flip-flops is 0 and this is supplied as one input to the addition circuit 67 to be added to the output of 2 taken from the D flip-flops 58. The output from the addition circuit 67 is compared with the number of good modules obtained from the encoder controller at the comparator 75. The number of good modules is six because two of the eight modules have failed, that is modules 2 and 5 have failed. Since this is less than the number of good modules, the comparator selects path A through the multiplexer 71. Thus, 2 (obtained from the addition circuit 67) is applied through path A of the multiplexer and is clocked into the starting point D flip-flops when a data adjusted pulse is received from the encoder controller 52. This is the same clock that is used to clock the D flip-flops 58 in FIG. 3. The new number that gets clocked into the D flip-flops 58 from the converter 20 is 4 (during time T to time 2T). The output to the memory 50 during this period is 2 and 4.

During this period of time T to time 2T, the outputs of 2 and 4 are added together in the addition circuit 67. The output from this addition circuit is 6 and this is equal to the number of good modules in the comparator circuit 75. Consequently, the comparator circuit 75 selects path D at the multiplexer 71. In the subtraction circuit 73, the number of good modules (6) is subtracted from 6. Consequently, the result of 0 is the output from subtractor circuit 73 and this is passed through the multiplexer 71 and is clocked into the starting point D flip-flops 69. The next number that gets clocked into the D flip-flops 58 in FIG. 3 is the number 3 (see the timing diagram of FIG. 27). The output to the memory 50 during the period from time 2T to time 3T is 0 and 3.

Zero and 3 are added together in the addition circuit 67. The output from the addition circuit 67 is 3. This is less than 6 and the comparator 75 selects path A at the multiplexer 71. Consequently, 3 is clocked through the multiplexer at path A into the starting point D flip-flops 69. At this time (see the timing diagram of FIG. 27), the number that gets clocked into the D flip-flops 58 is 7. The output to the memory 50 during the time period from time 3T to time 4T is 3 and 7.

At the addition circuit 67, 3 and 7 are now added together. The output from the addition circuit 67 is 10 and this is greater than 6. Consequently, the comparator 75 selects path B through the multiplexer 71 to the starting point D flip-flops 69. Four is clocked into the starting point D flip-flops 69 (see the timing diagram of FIG. 27). The number that gets clocked into the D flip-flops (58) is 1. The output to the memory 50 during the time period from time 4T to time 5T is 4 and 1.

EEPROM Write Mode

Figure 28:
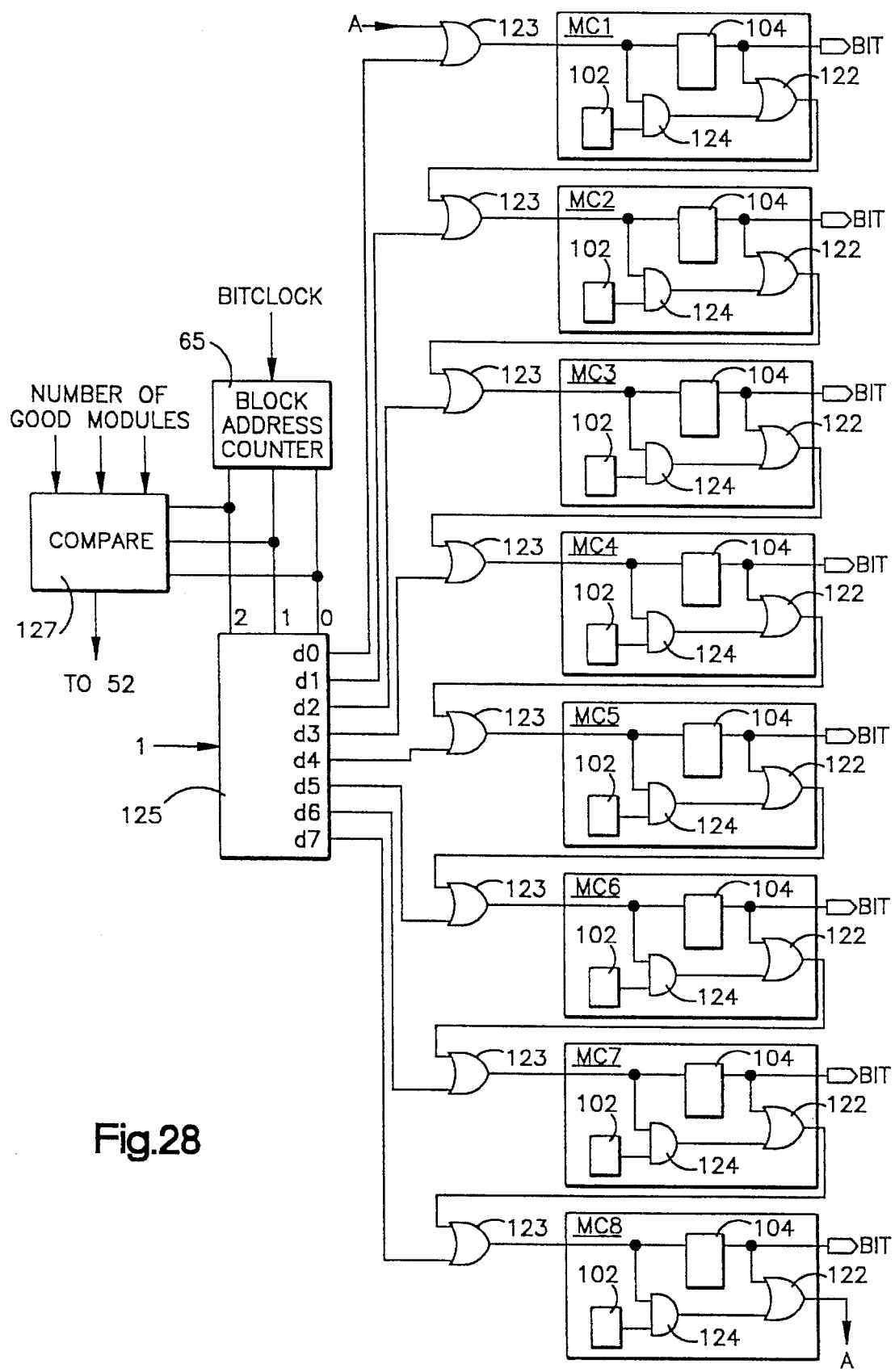
FIG. 28 illustrates the manner in which the module D flip-flops are interconnected during the EEPROM write mode of operation employing the starting point circuit described hereinbefore.

The encoder controller 52 (FIG. 3) as modified by the circuitry shown in FIGS. 25, 26 and 28 will rewrite memory 50 in order to compensate for the failed modules. This operation is essentially the same as that discussed hereinbefore with reference to FIGS. 15, 16, 17 and 18. That discussion is to be modified in light of the starting point circuitry SPC and the discussion that follows.

Table IV is the contents that need to be written into memory 50. This is similar to Table II which was written into the memory in the previous discussion. In this version with the starting point circuitry it is to be noted that Table IV is divided into eight blocks, block 0 through block 7. Block 0 includes the first eight memory addresses and the outputs that are to be written into the memory. Block 1 includes the next eight addresses and the output to be written into the memory at those addresses. Blocks 2, 3, 4, 5, 6, and 7 are the succeeding blocks of addresses and the outputs to be written into the memory at those addresses. One block will be written at a time.

Figure 29:
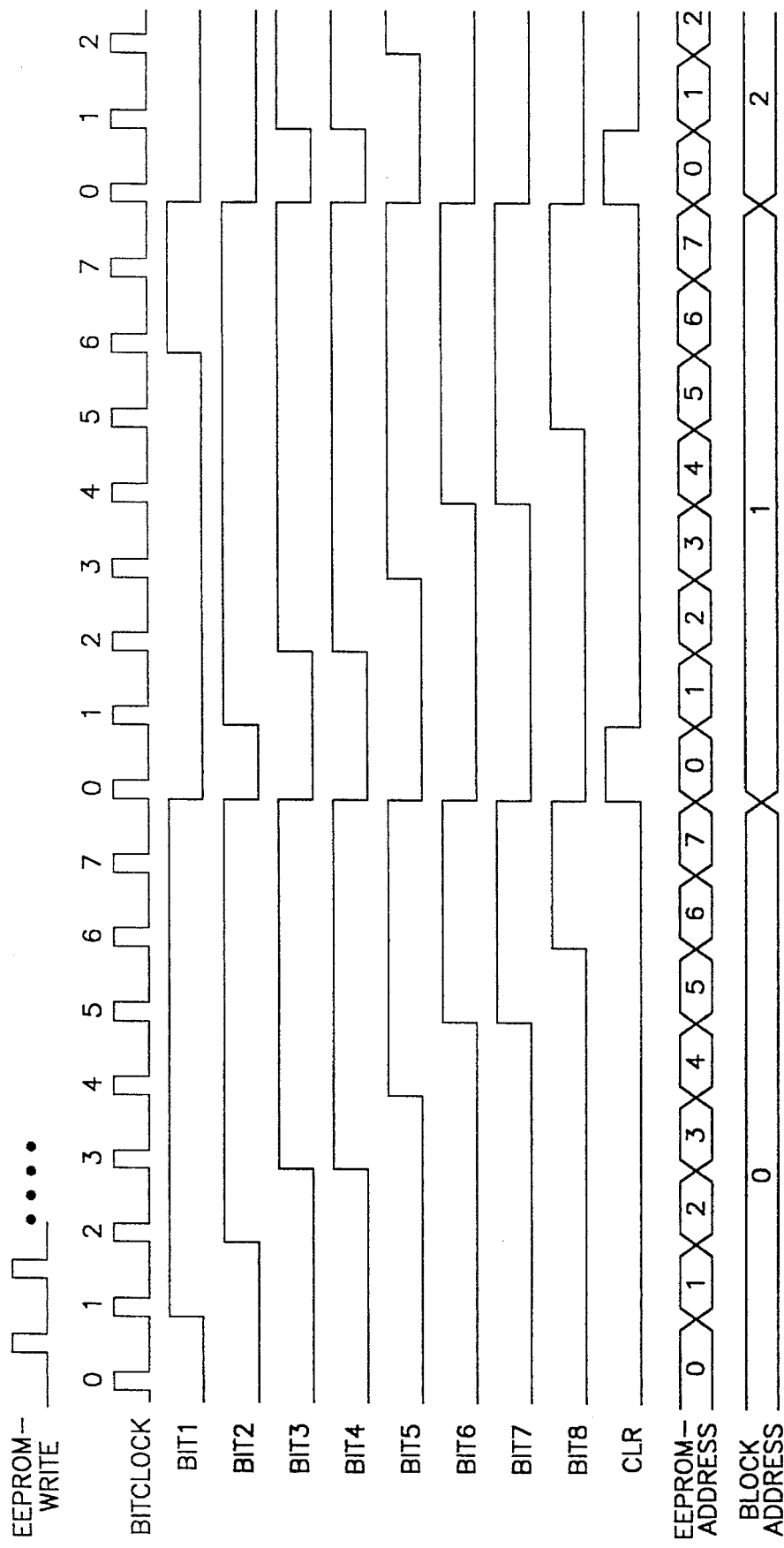
FIG. 29 includes graphical waveforms of voltage with respect to time useful in explaining the operation of the EEPROM write mode of operation when there are two failed modules and wherein the circuitry includes the starting point circuit.

Reference is now made to FIGS. 28 and 29 which are similar to FIGS. 16, 17 and 18 discussed hereinbefore. FIG. 28 shows the manner in which the module cells MC1 through MC8 are connected in a stacked configuration with an addition including an OR gate 123 which connects the output of each OR gate 122 in a module cell with the AND gate 124 in the next module cell. The second input to each of the eight OR gates 123 is obtained from one of the outputs d0 through d7 of a demultiplexer 125. The output of the OR gate 122 of the last module cell MC8 in FIG. 28 is connected at point A to an input of OR gate 123 associated with the first module cell MC1. The block address counter 65 (see FIG. 25) counts the BIT CLOCK pulses (see FIG. 29). Each time eight pulses have been counted, a one signal is sequenced from one of the outputs d0 to the next output d1, etc. The block address counter contains the number of the block that is being written into the memory 50. This is initially set at 0. Consequently, the output from the demultiplexer 125 will be a binary 1 on line d0. This is supplied to the module cell MC1 by way of the first OR gate 123. The next eight BIT CLOCK pulses are used to write the information in block 0 (see Table IV) of the memory. The memory address counter 62 (see FIGS. 3 and 25) counts to seven while the block address counter 65 is at a count of 0. The flip-flop 104 in each of the module cells is cleared.

The block address counter 65 is incremented to a count of 1 after the first eight BIT CLOCK pulses have been counted. Thus, the output from the demultiplexer 125 will provide a binary 1 signal on output line d1. This goes to the module cell MC2. The next eight BIT CLOCK pulses are used to write block 1 (see Table IV) into the memory 50. The memory address counter 62 counts to 7 while the block address counter is at a count of 1. The flip-flop 104 of each module cell is cleared.

After eight more BIT CLOCK pulses have been counted, the output of the block address counter 65 will be at a count of 2. Consequently, this raises the output of line d2 which goes into the module cell MC3. The next eight BIT CLOCK pulses are used to write block 2 into the memory 50. This process continues until all eight blocks of the memory have been written. It is to be noted that a comparator 127 compares the output of the block address counter 65 with the number of good modules provided by the encoder controller. Since the number of good modules in the example being presented is six, once a comparison has been accomplished, the comparator supplies an indication of this to the encoder controller 52. This indicates to the encoder controller that the data to be written into blocks 6 and 7 represents a don't care. Consequently, there is no need to write any particular data into these two blocks of the memory. If three modules have failed, then all of the data for block 5 in Table IV would also be don't care data, etc.

Whereas the invention has been described in conjunction with a particular embodiment, it is to be appreciated that various modifications will occur to those skilled in the art within the spirit and scope of the invention as defined by the appended claims.

Having described the invention, the following is claimed:

1. A pulse step modulator comprising:

a plurality of N unit step modules, each including a DC voltage source and an associated actuatable switching means for, when actuated, turning on an associated said module providing a unit step voltage;

an output circuit connected to said N modules for providing an output voltage to a load wherein the magnitude of the output voltage is equal to the sum of all of the voltage sources of the modules that are turned on;

addressable memory means having a plurality of addressable storage locations, each storing and providing, when addressed, a pattern of N control signals respectively associated with said N modules with each control signal being a turn on signal or a turn off signal for respectively controlling the turn on or turn off of an associated module;

addressing means for addressing said memory means to obtain said control signals therefrom with each address including a turn on portion and a start portion with said turn on portion including information representative of the number of modules that are to be turned on and said start portion including information representing the address of the first of said N modules that is to be turned on.

2. A pulse step modulator comprising:

a plurality of N unit step modules, each including a DC voltage source and an associated actuatable switching means for, when actuated, turning on an associated said module providing a unit step voltage;

an output circuit connected to said N modules for providing an output voltage to a load wherein the magnitude of the output voltage is equal to the sum of all of the voltage sources of the modules that are turned on;

addressable memory means having a plurality of addressable storage locations, each storing and providing, when addressed, a pattern of N control signals respectively associated with said N modules with each control signal being a turn on signal or a turn off signal for respectively controlling the turn on or turn off of an associated module;

addressing means for addressing said memory means to obtain said control signals therefrom with each address including a turn on portion and a start portion with said turn on portion including information representative of the number of modules that are to be turned on and said start portion including information representing the address of the first of said N modules that is to be turned on; and wherein said addressing means includes a first addressing means for providing said turn on portion and a second addressing means for providing said start portion.

3. A pulse step modulator as set forth in claim 2 wherein said first addressing means includes an analog-to-digital converter for receiving an input signal and providing a first signal having a value that varies with the magnitude of said input signal and which represents the number of said modules that are to be turned on.

4. A pulse step modulator as set forth in claim 3 including fault detector means for monitoring the operation of said modules and providing a fault indication representative of the number of faulted modules.

5. A pulse step modulator as set forth in claim 4 including modifying means for modifying the value of said first signal in accordance with said fault indication.

6. A pulse step modulator as set forth in claim 5 wherein said modifying means includes subtraction means for subtracting the number of faulted modules as represented by said fault indication from the value of said input signal to provide a modified input signal for use as said turn on portion.

7. A pulse step modulator as set forth in claim 3 including memory rewriting means to change the number of turn on signals stored at each of said addressable storage location.

8. A pulse step modulator as set forth in claim 7 including fault detector means for determining the number of modules that have faulted in an on condition and providing a faulted on indication in accordance therewith.

9. A pulse step modulator as set forth in claim 8 wherein said memory rewriting means includes means for rewriting said memory means to change the number of turn on signals at each said addressable storage location in dependence upon the number of faulted modules detected by said fault detector means.

10. A pulse step modulator as set forth in claim 8 including combining means for combining said first signal with said faulted indication to provided a modified first signal for use as said turn on portion address for addressing said addressable memory means.

11. A pulse step modulator as set forth in claim 10 wherein said signal combining means includes subtracting means for subtracting the number represented by said faulted on indication from the number of turn on signals represented by said first signal.

12. A pulse step modulator as set forth in claim 2 wherein said second addressing means includes a starting point circuit having addition means for adding the value of the last start portion to the value of the turn on portion to provide a summation representation.

13. A pulse step modulator as set forth in claim 12 including means for determining the number of good modules and providing a good module representation.

14. A pulse step modulator as set forth in claim 13 including means for subtracting the number of good modules represented by said good module representation from the number represented by said summation representation and providing a difference representation in accordance therewith.

15. A pulse step modulator as set forth in claim 14 including selecting means for selecting said summation representation or said difference representation as the next said start portion of said address.

16. A pulse step modulator as set forth in claim 15 wherein said selecting means includes comparing means for comparing the numbers represented by said summation representation and said difference representation and making said selection in accordance therewith.

17. A modulator comprising:
a plurality of N unit modules, each including a signal source and an associated actuatable switching means for, when actuated, turning on an associated said module providing a unit signal;
an output circuit connected to said N modules for providing an output signal to a load wherein the magnitude of the output signal is equal to the sum of all of the signal sources of the modules that are turned on;
addressable memory means having a plurality of addressable storage locations, each storing and providing, when addressed, a pattern of N control signals respectively associated with said N modules with each control signal being a turn on signal or a turn off signal for respectively controlling the turn on or turn off of an associated module;
addressing means for addressing said memory means to obtain said control signals therefrom with each address including a turn on portion and a start portion with said turn on portion including information representative of the number of modules that are to be turned on and said start portion including information representing the address of the first of said N modules that is to be turned on.

18. A modulator comprising:
a plurality of N unit modules, each including a signal source and an associated actuatable switching means for, when actuated, turning on an associated said module providing a unit signal;
an output circuit connected to said N modules for providing an output signal to a load wherein the magnitude of the output signal is equal to the sum of all of the signal sources of the modules that are turned on;
addressable memory means having a plurality of addressable storage locations, each storing and providing, when addressed, a pattern of N control signals respectively associated with said N modules with each control signal being a turn on signal or a turn off signal for respectively controlling the turn on or turn off of an associated module;
addressing means for addressing said memory means to obtain said control signals therefrom with each address including a turn on portion and a start portion with said turn on portion including information representative of the number of modules that are to be turned on and said start portion including information representing the address of the first of said N modules that is to be turned on; and
wherein said addressing means includes a first addressing means for providing said turn on portion and a second addressing means for providing said start portion.

19. A modulator as set forth in claim 18 wherein said first addressing means includes an analog-to-digital converter for receiving an input signal and providing a first signal having a value that varies with the magnitude of said input signal and which represents the number of said modules that are to be turned on.

20. A modulator as set forth in claim 19 including fault detector means for monitoring the operation of said modules and providing a fault indication representative of the number of faulted modules.

21. A modulator as set forth in claim 20 including modifying means for modifying the value of said first signal in accordance with said fault indication.

22. A modulator as set forth in claim 21 wherein said modifying means includes subtraction means for subtracting the number of faulted modules as represented by said fault indication from the value of said input signal to provide a modified input signal for use as said turn on portion.

23. A modulator as set forth in claim 19 including memory rewriting means to change the number of turn on signals stored at each of said addressable storage location.

24. A modulator as set forth in claim 23 including fault detector means for determining the number of modules that have faulted in an on condition and providing a faulted on indication in accordance therewith.

25. A modulator as set forth in claim 24 wherein said memory rewriting means includes means for rewriting said memory means to change the number of turn on signals at each said addressable storage location in dependence upon the number of faulted modules detected by said fault detector means.

26. A modulator as set forth in claim 24 including combining means for combining said first signal with said faulted indication to provided a modified first signal for use as said turn on portion address for addressing said addressable memory means.

27. A modulator as set forth in claim 26 wherein said signal combining means includes subtracting means for subtracting the number represented by said faulted on indication from the number of turn on signals represented by said first signal.

28. A modulator as set forth in claim 18 wherein said second addressing means includes a starting point circuit having addition means for adding the value of the last start portion to the value of the turn on portion to provide a summation representation.

29. A modulator as set forth in claim 28 including means for determining the number of good modules and providing a good module representation.

30. A modulator as set forth in claim 29 including means for subtracting the number of good modules represented by said good module representation from the number represented by said summation representation and providing a difference representation in accordance therewith.

31. A modulator as set forth in claim 30 including selecting means for selecting said summation representation or said difference representation as the next said start portion of said address.

32. A modulator as set forth in claim 31 wherein said selecting means includes comparing means for comparing the numbers represented by said summation representation and said difference representation and making said selection in accordance therewith.

33. A pulse step modulator comprising:

a plurality of N series connected unit step modules, each including a DC voltage source and an associated actuatable switching means for, when actuated, turning on an associated said module to provide a unit step voltage;

an output circuit connected to said N series connected modules for providing an output voltage to a load wherein the magnitude of the output voltage is equal to the sum of all of the voltage sources of the modules that are turned on;

means for providing a plurality of turn on signals, each for actuating a said switching means in one of said modules, such that the number of turn on signals is dependent upon the magnitude of an input signal;

said turn on signals providing means including addressable memory means and addressing means;

said addressable memory means having a plurality of addressable storage locations, each including a pattern of N multi-bit control signals, each control signal having a first turn on level or a second turn on level, said N control signals serving to respectively control the turn on or turn off function of said N modules;

said addressing means including means for providing a plurality of addresses, each including a multi-bit word including a start point word portion and a turn on word portion wherein said turn on word portion includes information representing the number of turn on signals to be provided for turning on a number of said modules in dependence upon the magnitude of said input signal and said start word portion including information as to which module should be turned on first.

34. A modulator comprising:

a plurality of N series connected unit modules, each including a signal source and an associated actuatable switching means for, when actuated, turning on an associated said module to provide a unit signal;

an output circuit connected to said N series connected modules for providing an output signal to a load wherein the magnitude of the output signal is equal to the sum of all of the signal sources of the modules that are turned on;

means for providing a plurality of turn on signals, each for actuating a said switching means in one of said modules, such that the number of turn on signals is dependent upon the magnitude of an input signal;

said turn on signals providing means including addressable memory means and addressing means;

said addressable memory means having a plurality of addressable storage locations, each including a pattern of N multi-bit control signals, each control signal having a first turn on level or a second turn on level, said N control signals serving to respectively control the turn on or turn off function of said N modules;

said addressing means including means for providing a plurality of addresses, each including a multi-bit word including a start point word portion and a turn on word portion wherein said turn on word portion includes information representing the number of turn on signals to be provided for turning on a number of said modules in dependence upon the magnitude of said input signal and said start word portion including information as to which module should be turned on first.

* * * * *